US012334875B2

(12) United States Patent
Takahashi et al.

(10) Patent No.: US 12,334,875 B2
(45) Date of Patent: Jun. 17, 2025

(54) SEMICONDUCTOR DEVICE AND OPERATION METHOD THEREOF

(71) Applicant: Semiconductor Energy Laboratory Co., Ltd., Atsugi (JP)

(72) Inventors: Kei Takahashi, Isehara (JP); Takayuki Ikeda, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 626 days.

(21) Appl. No.: 17/632,284

(22) PCT Filed: Aug. 20, 2020

(86) PCT No.: PCT/IB2020/057814
§ 371 (c)(1),
(2) Date: Feb. 2, 2022

(87) PCT Pub. No.: WO2021/038390
PCT Pub. Date: Mar. 4, 2021

(65) Prior Publication Data
US 2022/0302880 A1    Sep. 22, 2022

(30) Foreign Application Priority Data

Aug. 29, 2019    (JP) .................................. 2019-156546

(51) Int. Cl.
*H03F 1/26* (2006.01)
*H03F 3/00* (2006.01)
(Continued)

(52) U.S. Cl.
CPC ............... *H03F 1/26* (2013.01); *H03F 3/005* (2013.01); *H03F 3/387* (2013.01);
(Continued)

(58) Field of Classification Search
CPC . H03F 1/26; H03F 3/005; H03F 3/387; H03F 2200/372; H03F 3/393;
(Continued)

(56) References Cited

U.S. PATENT DOCUMENTS 5,148,167 A    9/1992   Ribner
5,477,481 A    12/1995  Kerth
(Continued)

FOREIGN PATENT DOCUMENTS

CN    104698871 A    6/2015
CN    106160671 A    11/2016
(Continued)

OTHER PUBLICATIONS

International Search Report (Application No. PCT/IB2020/057814) Dated Dec. 15, 2020.
(Continued)

*Primary Examiner* — Andrea Lindgren Baltzell
*Assistant Examiner* — Jose E Pinero
(74) *Attorney, Agent, or Firm* — Eric J. Robinson; Robinson Intellectual Property Law Office, P.C.

(57) ABSTRACT

A semiconductor device includes a switch, a capacitor, a chopping circuit, and an amplifier. The amplifier includes a non-inverting input terminal, an inverting input terminal, an inverting output terminal, and a non-inverting output terminal. The semiconductor device, with use of the switch and the capacitor, has a function of sampling and holding a first potential and a second potential input in a first period. The chopping circuit is provided on each of the input terminal side and the output terminal side of the amplifier, and the first potential and the second potential are each input to either one of the non-inverting input terminal and the inverting input terminal in a second period. In a third period, the first potential and the second potential are each input to
(Continued)

either one of the non-inverting input terminal and the inverting input terminal, which is different from the second period.

6 Claims, 16 Drawing Sheets

(51) Int. Cl.
    *H03F 3/387*       (2006.01)
    *H10B 12/00*       (2023.01)
    *H10D 30/67*       (2025.01)
    *H10D 86/40*       (2025.01)
    *H10D 86/60*       (2025.01)
    *H10D 87/00*       (2025.01)

(52) U.S. Cl.
    CPC ........ *H03F 2200/372* (2013.01); *H10B 12/00* (2023.02); *H10D 30/6734* (2025.01); *H10D 30/6755* (2025.01); *H10D 86/423* (2025.01); *H10D 86/481* (2025.01); *H10D 86/60* (2025.01); *H10D 87/00* (2025.01)

(58) Field of Classification Search
    CPC ............. H03F 3/45192; H03F 3/45475; H03F 2203/45534; H03F 2203/45551; H03F 3/345; H03F 3/70; H01L 27/1207; H01L 27/1225; H01L 27/1255; H01L 29/78648; H01L 29/7869; H10B 12/00
    USPC .......................................................... 330/10
    See application file for complete search history.

(56) References Cited

U.S. PATENT DOCUMENTS

| | | | |
|---|---|---|---|
| 5,926,066 | A | 7/1999 | Sauer |
| 6,262,626 | B1 | 7/2001 | Bakker et al. |
| 6,734,723 | B2 | 5/2004 | Huijsing et al. |
| 6,911,864 | B2 | 6/2005 | Bakker et al. |
| 6,961,385 | B2 | 11/2005 | Plisch et al. |
| 7,310,016 | B2 | 12/2007 | Chuang |
| 7,385,443 | B1 | 6/2008 | Denison |
| 7,391,257 | B1 | 6/2008 | Denison et al. |
| 7,456,684 | B2 | 11/2008 | Fang et al. |
| 7,589,587 | B2 | 9/2009 | Yoshida et al. |
| 8,471,744 | B1 * | 6/2013 | Wan ...................... H03M 3/34 341/172 |
| 8,766,608 | B2 | 7/2014 | Yamazaki et al. |
| 8,803,559 | B2 | 8/2014 | Toyotaka |
| 8,963,517 | B2 | 2/2015 | Yamazaki et al. |
| 9,473,074 | B1 | 10/2016 | Blom |
| 9,634,626 | B2 | 4/2017 | Zhong |
| 9,984,624 | B2 | 5/2018 | Takahashi et al. |
| 10,056,867 | B2 | 8/2018 | Wang et al. |
| 10,079,577 | B2 | 9/2018 | Wang et al. |
| 10,411,664 | B2 | 9/2019 | Stanescu et al. |
| 10,673,389 | B2 | 6/2020 | Sloboda et al. |
| 10,763,878 | B2 | 9/2020 | Ali et al. |
| 2001/0011923 | A1 | 8/2001 | Bakker et al. |
| 2008/0106330 | A1 | 5/2008 | Yoshida et al. |
| 2016/0233840 | A1 | 8/2016 | Wang et al. |
| 2018/0175804 | A1 * | 6/2018 | Wang ...................... H03F 1/26 |

FOREIGN PATENT DOCUMENTS

| | | |
|---|---|---|
| EP | 3079133 A | 10/2016 |
| JP | 2002-530916 | 9/2002 |
| JP | 2008-067050 A | 3/2008 |
| JP | 2016-528854 | 9/2016 |
| JP | 2018-517328 | 6/2018 |
| KR | 2001-0034031 A | 4/2001 |
| WO | WO-2000/030249 | 5/2000 |
| WO | WO-2015/081828 | 6/2015 |
| WO | WO-2016/161839 | 10/2016 |

OTHER PUBLICATIONS

Written Opinion (Application No. PCT/IB2020/057814) Dated Dec. 15, 2020.

Chapter 12 Introduction to Switched-Capacitor Circuits, Design of Analog CMOS Integrated Circuits, Mar. 1, 2003, pp. 495-498.

Yamazaki.S et al., "Properties of crystalline In—Ga—Zn-oxide semiconductor and its transistor characteristics", Jpn. J. Appl. Phys. (Japanese Journal of Applied Physics), Mar. 31, 2014, vol. 53, No. 4S, pp. 04ED18-1-04ED18-10.

Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics), 2012, vol. 51, pp. 021201-1-021201-7.

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

Razavi Behzad, "Chapter 12 Introduction to Switched-Capacitor Circuits", Design of Analog CMOS Integrated Circuits, Aug. 15, 2000, pp. 405-409, Mc Graw Hill.

* cited by examiner

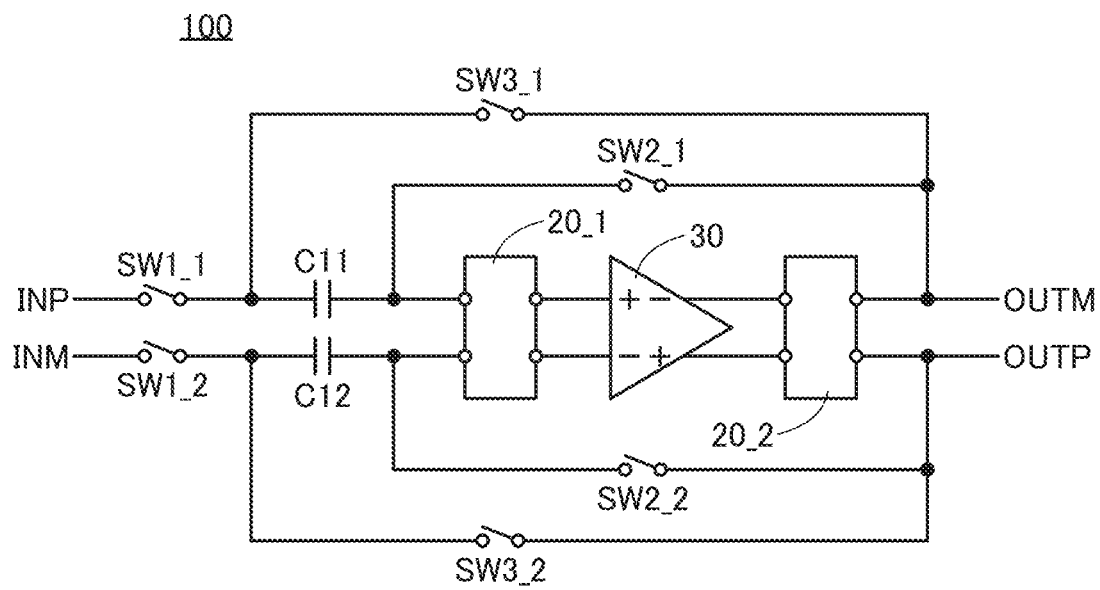

20

20

30

30

FIG. 10A
FIG. 10C
FIG. 10B
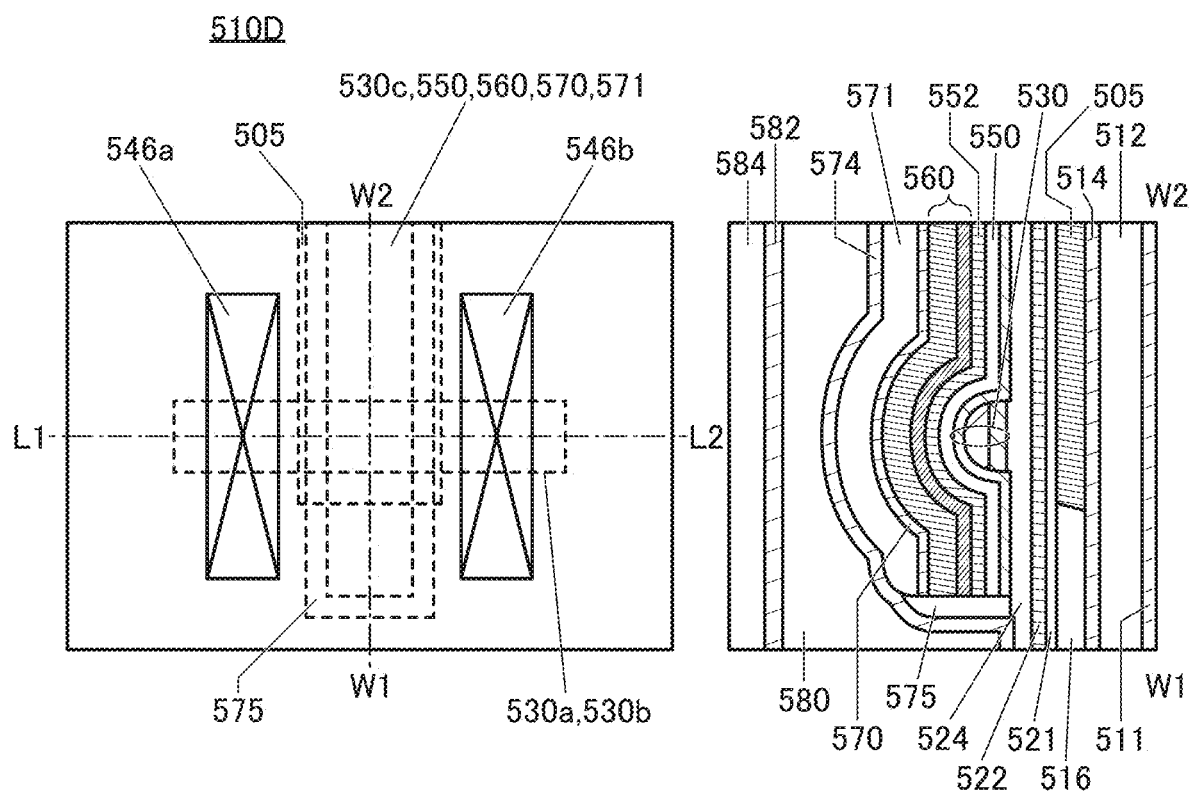
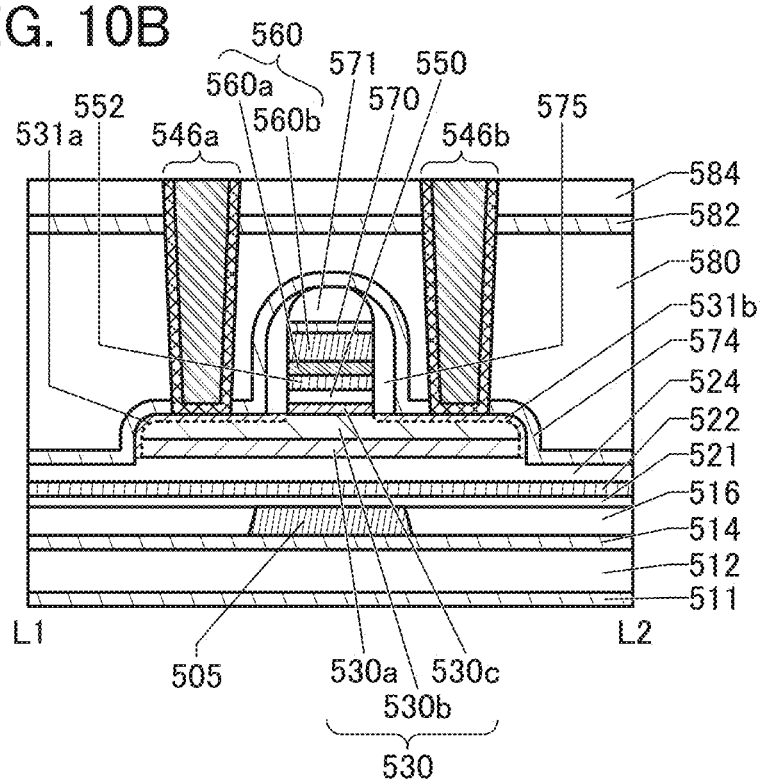

FIG. 16A
| Amorphous | Intermediate state New crystalline phase Crystalline | Crystal |
|---|---|---|
| •completely amorphous | •CAAC •nc •CAC | •single crystal •poly crystal |
FIG. 16B
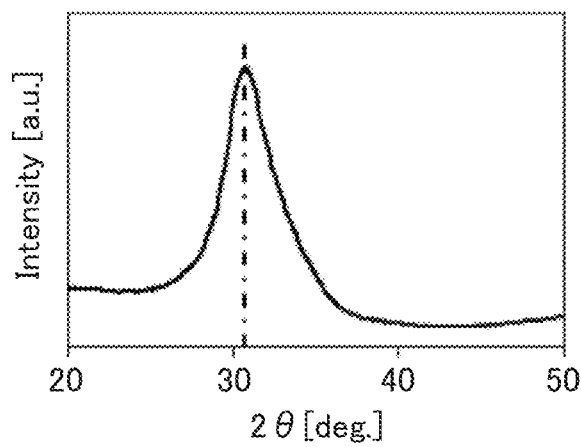
FIG. 16C
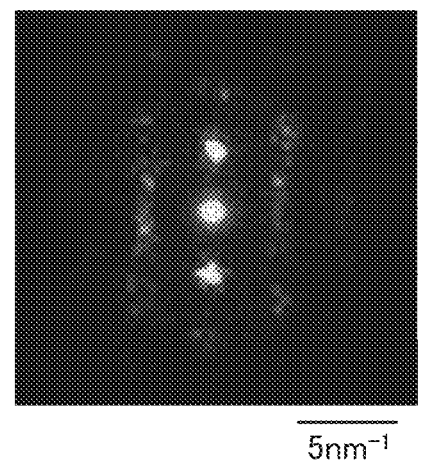

SEMICONDUCTOR DEVICE AND OPERATION METHOD THEREOF

TECHNICAL FIELD

The present invention relates to a semiconductor device and an operation method thereof. In particular, the present invention relates to a semiconductor device including an amplifier (also referred to as an amplifier circuit) with improved accuracy.

In this specification and the like, a semiconductor device refers to a device that utilizes semiconductor characteristics, such as a circuit including a semiconductor element (a transistor, a diode, a photodiode, and the like), a device including the circuit, and the like. In this specification and the like, a semiconductor device refers to any device that can function by utilizing semiconductor characteristics; examples of the semiconductor device include an integrated circuit, a chip provided with an integrated circuit, an electronic component in which a chip is incorporated in a package, and an electronic device provided with an integrated circuit.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter.

BACKGROUND ART

As one of techniques of a semiconductor circuit, a technique of a switched capacitor circuit has been known in which a switch (also referred to as a switching element) is combined with a capacitor (also referred to as a capacitor element) and the switch controls charge and discharge of the capacitor. Temperature dependence of the electric characteristics of a switched capacitor circuit is small, and the switched capacitor circuit can be used in place of a resistor (also referred to as a resistor element) in a semiconductor circuit; thus, a semiconductor device having small temperature dependence can be achieved.

In addition, a technique of using a switched capacitor circuit and an amplifier in combination has been known (see Non-Patent Document 1). A semiconductor device in which a switched capacitor circuit and an amplifier are combined (such a semiconductor device is also referred to as a switched capacitor amplifier) can, with a signal (potential) to be input to the semiconductor device being sampled and held in a capacitor, achieve a highly accurate amplifier.

Meanwhile, a transistor including an oxide semiconductor or a metal oxide in a channel formation region (also referred to as an oxide semiconductor (OS) transistor) has been attracting attention. The drain current of an OS transistor in an off state (such a current is also referred to as an off-state current) is extremely low (e.g., see Non-Patent Documents 2 and 3); when an OS transistor is used in a memory cell of a DRAM, for example, electric charge accumulated in a capacitive element can be retained for a long time.

A CAAC (c-axis aligned crystalline) structure and an nc (nanocrystalline) structure, which are neither single crystal nor amorphous, have been found in an oxide semiconductor (see Non-Patent Document 2 and Non-Patent Document 4). Non-Patent Document 2 and Non-Patent Document 4 also disclose a technique for fabricating a transistor using an oxide semiconductor having a CAAC structure.

REFERENCE

Non-Patent Document

[Non-Patent Document 1] "Design of Analog CMOS Integrated Circuits (Application)", Behzad Razavi (supervised and translated by Tadahiro Kuroda), Maruzen Publishing Co., Ltd. (March 2003), pp. 495-498.

[Non-Patent Document 2] S. Yamazaki et al., "Properties of crystalline In-Ga-Zn-oxide semiconductor and its transistor characteristics", Jpn. J. Appl. Phys., vol. 53, 04ED18 (2014).

[Non-Patent Document 3] K. Kato et al., "Evaluation of Off-State Current Characteristics of Transistor Using Oxide Semiconductor Material, Indium-Gallium-Zinc Oxide", Jpn. J. Appl. Phys., vol. 51, 021201 (2012).

[Non-Patent Document 4] S. Yamazaki et al., "SID Symposium Digest of Technical Papers", 2012, volume 43, issue 1, pp. 183-186

SUMMARY OF THE INVENTION

Problems to be Solved by the Invention

In an amplifier including a non-inverting input terminal and an inverting input terminal, for example, amplifier-induced noise such as offset voltage which is output even when a potential difference between the non-inverting input terminal and the inverting input terminal is 0 V, 1/f noise for which the noise power is inversely proportional to the frequency and which can hardly be filtered out, or thermal noise which is caused when a free electron moves randomly with thermal energy is superimposed on the output even in a period when a switched capacitor amplifier is sampling an input signal and holding the signal in the capacitor, and the removal of such noise is difficult, which has been problematic.

An object of one embodiment of the present invention is to provide a switched capacitor amplifier in which an effect of amplifier-induced noise on an output is reduced. Another object of one embodiment of the present invention is to provide a semiconductor device including an amplifier, in which an effect of amplifier-induced noise on an output is reduced. Another object of one embodiment of the present invention is to provide a semiconductor device including an amplifier, in which the accuracy of the amplifier is improved.

Note that one embodiment of the present invention does not necessarily have to achieve all the above-described objects and only needs to achieve at least one of the objects. The descriptions of the above objects do not preclude the existence of other objects. Objects other than these will be apparent from the descriptions of the specification, the claims, the drawings, and the like, and objects other than these can be derived from the descriptions of the specification, the claims, the drawings, and the like.

Means for Solving the Problems

One embodiment of the present invention is a semiconductor device including a switch, first and second capacitors, first and second chopping circuits, an amplifier, first and second input terminals, and first and second output terminals. The amplifier includes a non-inverting input terminal, an inverting input terminal, an inverting output terminal, and a non-inverting output terminal. In a first period, the semiconductor device electrically connects the first input terminal and one terminal of the first capacitor, electrically connects the second input terminal and one terminal of the second capacitor, electrically connects the other terminal of the first capacitor and the first output terminal, and electrically connects the other terminal of the second capacitor and the second output terminal; the first chopping circuit electrically connects the other terminal of the first capacitor and the non-inverting input terminal and electrically connects the other terminal of the second capacitor and the inverting input terminal; and the second chopping circuit electrically connects the inverting output terminal and the first output terminal and electrically connects the non-inverting output terminal and the second output terminal. In a second period, the semiconductor device electrically connects the one terminal of the first capacitor and the first output terminal and electrically connects the one terminal of the second capacitor and the second output terminal; the first chopping circuit electrically connects the other terminal of the first capacitor and the non-inverting input terminal and electrically connects the other terminal of the second capacitor and the inverting input terminal, and the second chopping circuit electrically connects the inverting output terminal and the first output terminal and electrically connects the non-inverting output terminal and the second output terminal. In a third period, the semiconductor device electrically connects the one terminal of the first capacitor and the first output terminal and electrically connects the one terminal of the second capacitor and the second output terminal; the first chopping circuit electrically connects the other terminal of the first capacitor and the inverting input terminal and electrically connects the other terminal of the second capaci- tor and the non-inverting input terminal; and the second chopping circuit electrically connects the non-inverting output terminal and the first output terminal and electrically connects the inverting output terminal and the second output terminal.

In the above embodiment, the switch, the first chopping circuit, and the second chopping circuit each include a transistor, and the transistor includes a metal oxide in a channel formation region.

Another embodiment of the present invention is an operation method of a semiconductor device including a switch, first and second capacitors, first and second chopping circuits, an amplifier, first and second input terminals, and first and second output terminals. The amplifier includes a non-inverting input terminal, an inverting input terminal, an inverting output terminal, and a non-inverting output terminal. In a first period, the semiconductor device electrically connects the first input terminal and one terminal of the first capacitor, electrically connects the second input terminal and one terminal of the second capacitor, electrically connects the other terminal of the first capacitor and the first output terminal, and electrically connects the other terminal of the second capacitor and the second output terminal; the first chopping circuit electrically connects the other terminal of the first capacitor and the non-inverting input terminal and electrically connects the other terminal of the second capacitor and the inverting input terminal; and the second chopping circuit electrically connects the inverting output terminal and the first output terminal and electrically connects the non-inverting output terminal and the second output terminal. In a second period, the semiconductor device electrically connects the one terminal of the first capacitor and the first output terminal and electrically con- nects the one terminal of the second capacitor and the second output terminal; the first chopping circuit electrically con- nects the other terminal of the first capacitor and the non-inverting input terminal and electrically connects the other terminal of the second capacitor and the inverting input terminal, and the second chopping circuit electrically con- nects the inverting output terminal and the first output terminal and electrically connects the non-inverting output terminal and the second output terminal. In a third period, the semiconductor device electrically connects the one ter- minal of the first capacitor and the first output terminal and electrically connects the one terminal of the second capaci- tor and the second output terminal; the first chopping circuit electrically connects the other terminal of the first capacitor and the inverting input terminal and electrically connects the other terminal of the second capacitor and the non-inverting input terminal; and the second chopping circuit electrically connects the non-inverting output terminal and the first output terminal and electrically connects the inverting out- put terminal and the second output terminal.

In the above embodiment, the switch, the first chopping circuit, and the second chopping circuit each include a transistor, and the transistor includes a metal oxide in a channel formation region.

Another embodiment of the present invention is a semi- conductor device including first to sixth switches, first and second capacitors, first and second chopping circuits, an amplifier, first and second input terminals, and first and second output terminals. The amplifier includes a non- inverting input terminal, an inverting input terminal, an inverting output terminal, and a non-inverting output termi- nal; the first chopping circuit includes first to fourth termi- nals; and the second chopping circuit includes fifth to eighth terminals. The first input terminal is electrically connected to one terminal of the first switch, the second input terminal is electrically connected to one terminal of the second switch, the other terminal of the first switch is electrically connected to one terminal of the third switch and one terminal of the first capacitor, the other terminal of the second switch is electrically connected to one terminal of the fourth switch and one terminal of the second capacitor, the other terminal of the first capacitor is electrically connected to one terminal of the fifth switch and the first terminal, and the other terminal of the second capacitor is electrically connected to one terminal of the sixth switch and the second terminal. The third terminal is electrically connected to the non-inverting input terminal, the fourth terminal is electrically connected to the inverting input terminal, the inverting output terminal is electrically connected to the fifth terminal, the non- inverting output terminal is electrically connected to the sixth terminal, the seventh terminal is electrically connected to the other terminal of the third switch, the other terminal of the fifth switch, and the first output terminal, and the eighth terminal is electrically connected to the other terminal of the fourth switch, the other terminal of the sixth switch, and the second output terminal. In a first period, the first chopping circuit has a function of bringing the first terminal and the third terminal into a conduction state and a function of bringing the second terminal and the fourth terminal into a conduction state, and the second chopping circuit has a function of bringing the fifth terminal and the seventh terminal into a conduction state and a function of bringing the sixth terminal and the eighth terminal into a conduction state. In a second period, the first chopping circuit has a function of bringing the first terminal and the fourth terminal into a conduction state and a function of bringing the second terminal and the third terminal into a conduction state, and the second chopping circuit has a function of bringing the fifth terminal and the eighth terminal into a conduction state and a function of bringing the sixth terminal and the seventh terminal into a conduction state.

In the above embodiment, the first to sixth switches, the first chopping circuit, and the second chopping circuit each include a transistor, and the transistor includes a metal oxide in a channel formation region.

Effect of the Invention

According to one embodiment of the present invention, a switched capacitor amplifier in which an effect of amplifier-induced noise on an output is reduced can be provided. Alternatively, according to one embodiment of the present invention, a semiconductor device including an amplifier, in which an effect of amplifier-induced noise on an output is reduced, can be provided. Alternatively, according to one embodiment of the present invention, a semiconductor device including an amplifier, in which the accuracy of the amplifier is improved, can be provided.

Note that the descriptions of the above effects do not preclude the existence of other effects. Note that one embodiment of the present invention does not necessarily have to achieve all the above effects and only needs to have at least one of the effects. Effects other than these are apparent from the descriptions of the specification, the claims, the drawings, and the like, and effects other than these can be derived from the descriptions of the specification, the claims, the drawings, and the like.

BRIEF DESCRIPTION OF THE DRAWINGS

FIG. 1A is a block diagram showing a configuration example of a semiconductor device.

FIG. 1B, FIG. 1D, and FIG. 1F are diagrams each showing a symbol representing a switch.

FIG. 1C, FIG. 1E, and FIG. 1G are circuit diagrams each showing a configuration example of the switch.

FIG. 10A is a top view showing a structure example of a transistor.

FIG. 10B and FIG. 10C are cross-sectional views showing a structure example of the transistor.

FIG. 16A is a diagram describing the classification of crystal structures of IGZO.

FIG. 16B is a graph showing an XRD spectrum of a CAAC-IGZO film. FIG. 16C is an image showing a nano-beam electron diffraction pattern of a CAAC-IGZO film.

MODE FOR CARRYING OUT THE INVENTION

Figure 2A:
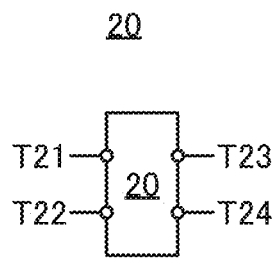
FIG. 2A is a diagram showing a symbol representing a chopping circuit.

Embodiments will be described below with reference to the drawings. However, the embodiments can be implemented in many different modes, and it will be readily appreciated by those skilled in the art that modes and details thereof can be changed in various ways without departing from the spirit and scope thereof. Thus, the present invention should not be construed as being limited to the following description of the embodiments.

A plurality of embodiments described below can be combined as appropriate. In addition, in the case where a plurality of structure examples are described in one embodiment, the structure examples can be combined as appropriate.

Note that in the drawings attached to this specification, the block diagram in which components are classified according to their functions and shown as independent blocks is illustrated; however, it is difficult to completely separate actual components according to their functions, and it is possible for one component to relate to a plurality of functions.

In the drawings and the like, the size, the layer thickness, the region, or the like is exaggerated for clarity in some cases. Therefore, they are not limited to the illustrated scale. The drawings schematically show ideal examples, and shapes, values, or the like are not limited to shapes, values, or the like shown in the drawings.

In the drawings and the like, the same elements, elements having similar functions, elements formed of the same material, elements formed at the same time, or the like are sometimes denoted by the same reference numerals, and description thereof is not repeated in some cases.

In this specification and the like, the term "film" and the term "layer" can be interchanged with each other. For example, the term "conductive layer" can be changed into the term "conductive film" in some cases. As another example, the term "insulating film" can be changed into the term "insulating layer" in some cases.

In this specification and the like, the terms for describing arrangement such as "over" and "below" do not necessarily mean "directly over" and "directly below", respectively, in the positional relationship between components. For example, the expression "a gate electrode over a gate insulating layer" does not exclude the case where there is an additional component between the gate insulating layer and the gate electrode.

In this specification and the like, ordinal numbers such as "first", "second", and "third" are used in order to avoid confusion among components, and the terms do not limit the components numerically.

In this specification and the like, when a plurality of components are denoted by the same reference signs, and in particular need to be distinguished from each other, an identification sign such as "_1","_2", "[n]", or "[m, n]" is sometimes added to the reference signs. For example, the second wiring GL is referred to as a wiring GL[2].

In this specification and the like, "electrically connected" includes the case where connection is made through an "object having any electric function". There is no particular limitation on the "object having any electric function" as long as electric signals can be transmitted and received between components that are connected through the object. Examples of the "object having any electric function" include a switching element such as a transistor, a resistor, an inductor, a capacitive element, and other elements with a variety of functions as well as an electrode and a wiring. Furthermore, even when the expression "being electrically connected" is used, there is a case in which no physical connection portion is made and a wiring is just extended in an actual circuit.

In addition, in this specification and the like, the term "electrode" or "wiring" does not functionally limit these components. For example, an "electrode" is used as part of a "wiring" in some cases, and vice versa.

In this specification and the like, a "terminal" in an electric circuit refers to a portion where a current or a potential is input (or output) or a signal is received (or transmitted). Accordingly, part of a wiring or an electrode functions as a terminal in some cases.

In general, a "capacitive element" has a structure in which two electrodes face each other with an insulator (dielectric) therebetween. Furthermore, in this specification and the like, cases where a "capacitive element" is one having a structure in which two electrodes face each other with an insulator therebetween, one having a structure in which two wirings face each other with an insulator therebetween, or one in which two wirings are positioned with an insulator therebetween, are included. In this specification and the like, a "capacitive element" is referred to as a "capacitor" or a "condenser" in some cases.

In this specification and the like, a "voltage" often refers to a potential difference between a given potential and a reference potential (e.g., a ground potential). Thus, a voltage and a potential difference can be interchanged with each other.

In this specification and the like, a transistor is an element having at least three terminals of a source, a drain, and a gate. Further, a channel formation region is included between the source (a source terminal, a source region, or a source electrode) and the drain (a drain terminal, a drain region, or a drain electrode), and a current can flow between the source and the drain through the channel formation region. Note that in this specification and the like, a channel formation region refers to a region through which a current mainly flows.

Furthermore, functions of a source and a drain might be switched when a transistor of opposite polarity is employed or the direction of current flow is changed in circuit operation, for example. Thus, the terms of a source and a drain are interchangeable in this specification and the like.

Furthermore, unless otherwise specified, an off-state current in this specification and the like refers to a drain current of a transistor in an off state (also referred to as a non-conduction state or a cutoff state). Unless otherwise specified, the off state of an n-channel transistor refers to a state where the voltage Vgs of a gate with respect to a source is lower than a threshold voltage Vth, and the off state of a p-channel transistor refers to a state where the voltage Vgs of a gate with respect to a source is higher than the threshold voltage Vth. That is, the off-state current of an n-channel transistor sometimes refers to a drain current at the time when the voltage Vgs of a gate with respect to a source is lower than the threshold voltage Vth.

In the above description of the off-state current, the drain may be replaced with the source. That is, the off-state current sometimes refers to a source current when a transistor is in the off state. In addition, a leakage current sometimes expresses the same meaning as the off-state current. Furthermore, in this specification and the like, the off-state current sometimes refers to a current that flows between a source and a drain when a transistor is in the off state.

Furthermore, in this specification and the like, an on-state current sometimes refers to a current that flows between a source and a drain when a transistor is in the on state (also referred to as a conduction state).

In this specification and the like, a metal oxide means an oxide of metal in a broad sense. Metal oxides are classified into an oxide insulator, an oxide conductor (including a transparent oxide conductor), an oxide semiconductor, and the like.

For example, in the case where a metal oxide is used in a channel formation region of a transistor, the metal oxide is referred to as an oxide semiconductor in some cases. That is to say, in the case where a metal oxide has at least one of an amplifying function, a rectifying function, and a switching function, the metal oxide can be referred to as a metal oxide semiconductor. In other words, a transistor including a metal oxide in a channel formation region can be referred to as an "oxide semiconductor transistor" or an "OS transistor". Similarly, a "transistor using an oxide semiconductor" is also a transistor including a metal oxide in a channel formation region.

Furthermore, in this specification and the like, a metal oxide containing nitrogen is also referred to as a metal oxide in some cases. A metal oxide containing nitrogen may be referred to as a metal oxynitride. The details of a metal oxide will be described later.

Embodiment 1

In this embodiment, a configuration example and an operation example of a semiconductor device related to one embodiment of the present invention will be described.

<Configuration Example of Semiconductor Device>

FIG. 1A is a block diagram showing a configuration example of a semiconductor device 100 according to one embodiment of the present invention. The semiconductor device 100 includes a switch SW1_1, a switch SW1_2, a switch SW2_1, a switch SW2_2, a switch SW3_1, a switch SW3_2, a capacitor C11, a capacitor C12, a chopping circuit 20_1, a chopping circuit 20_2, and an amplifier 30.

The semiconductor device 100 also includes an input terminal INP, an input terminal INM, an output terminal OUTP, and an output terminal OUTM. The chopping circuit 20_1, the chopping circuit 20_2, and the amplifier 30 each include a first terminal to a fourth terminal. The first terminal to the fourth terminal included in each of the chopping circuit 20_1, the chopping circuit 20_2, and the amplifier 30 will be described later.

Note that in this specification and the like, a reference numeral such as "_1" or "_2" is used to distinguish a plurality of components having similar functions. That is, the reference character "SW1" is used to refer to either one of the switch SW1_1 and the switch SW1_2 without specifying which, and the reference character "SW1_1" or "SW1_2" is used to refer to a specific one of the switch SW1_1 and the switch SW1_2.

In this specification and the like, expressions such as "input terminal", "output terminal", and "terminal" are used in order to describe input and output of signals and potentials between components; however, in some cases physical connecting portions such as "input terminal", "output terminal", and "terminal" do not exist in the actual circuit and the components are just electrically connected to each other via wirings, electrodes, or the like.

In the semiconductor device 100, the input terminal INP is electrically connected to one terminal of the switch SW1_1, the input terminal INM is electrically connected to one terminal of the switch SW1_2, the other terminal of the switch SW1_1 is electrically connected to one terminal of the switch SW3_1 and one terminal of the capacitor C11, and the other terminal of the switch SW1_2 is electrically connected to one terminal of the switch SW3_2 and one terminal of the capacitor C12.

The other terminal of the capacitor C11 is electrically connected to one terminal of the switch SW2_1 and the first terminal of the chopping circuit 20_1, the other terminal of the capacitor C12 is electrically connected to one terminal of the switch SW2_2 and the second terminal of the chopping circuit 20_1, the third terminal of the chopping circuit 20_1 is electrically connected to the first terminal of the amplifier 30, and the fourth terminal of the chopping circuit 20_1 is electrically connected to the second terminal of the amplifier 30.

The third terminal of the amplifier 30 is electrically connected to the first terminal of the chopping circuit 20_2; the fourth terminal of the amplifier 30 is electrically connected to the second terminal of the chopping circuit 20_2; the third terminal of the chopping circuit 20_2 is electrically connected to the other terminal of the switch SW2_1, the other terminal of the switch SW3_1, and the output terminal OUTM; and the fourth terminal of the chopping circuit 20_2 is electrically connected to the other terminal of the switch SW2_2, the other terminal of the switch SW3_2, and the output terminal OUTP.

<Configuration Example of Switch>

The switch SW1 can be formed using a transistor 11, for example. FIG. 1B is a diagram showing a symbol representing the switch SW1, and FIG. 1C is a circuit diagram showing a configuration example of the switch SW1. Note that in FIG. 1B and the like, two terminals of the switch SW1 are referred to as a terminal T11 and a terminal T12.

As shown in FIG. 1C, the switch SW1 includes the transistor 11, one of a source and a drain of the transistor 11 is electrically connected to the terminal T11, and the other of the source and the drain of the transistor 11 is electrically connected to the terminal T12. A signal S1 is input to a gate of the transistor 11, and the switch SW1 is a switch whose conduction state or non-conduction state is controlled by the signal S10. That is, when the signal S1 is at a high level, the terminal T11 and the terminal T12 are brought into a conduction state, and when the signal S1 is at a low level, the terminal T11 and the terminal T12 are brought into a non-conduction state.

The switch SW2 can be formed using a transistor 12, for example. FIG. 1D is a diagram showing a symbol representing the switch SW2, and FIG. 1E is a circuit diagram showing a configuration example of the switch SW2. Note that in FIG. 1D and the like, two terminals of the switch SW2 are referred to as a terminal T13 and a terminal T14. A configuration example of the switch SW2 is similar to that of the switch SW1, so the description thereof is omitted. The switch SW2 is a switch whose conduction state or non-conduction state is controlled by a signal S2; when the signal S2 is at the high level, the terminal T13 and the terminal T14 are brought into a conduction state, and when the signal S2 is at the low level, the terminal T13 and the terminal T14 are brought into a non-conduction state.

The switch SW3 can be formed using a transistor 13, for example. FIG. 1F is a diagram showing a symbol representing the switch SW3, and FIG. 1G is a circuit diagram showing a configuration example of the switch SW3. Note that in FIG. 1F and the like, two terminals of the switch SW3 are referred to as a terminal T15 and a terminal T16. A configuration example of the switch SW3 is similar to that of the switch SW1, so the description thereof is omitted. The switch SW3 is a switch whose conduction state or non-conduction state is controlled by a signal S3; when the signal S3 is at the high level, the terminal T15 and the terminal T16 are brought into a conduction state, and when the signal S3 is at the low level, the terminal T15 and the terminal T16 are brought into a non-conduction state.

<Configuration Example of Chopping Circuit>

The chopping circuit 20 can be formed using a transistor 21 to a transistor 24, for example. FIG. 2A is a diagram showing a symbol representing the chopping circuit 20, and FIG. 2B is a circuit diagram showing a configuration example of the chopping circuit 20.

In FIG. 2A and the like, four terminals of the chopping circuit 20 are referred to as a terminal T21 to a terminal T24. In the chopping circuit 20, the terminal T21 corresponds to the above-mentioned first terminal, the terminal T22 corresponds to the above-mentioned second terminal, the terminal T23 corresponds to the above-mentioned third terminal, and the terminal T24 corresponds to the above-mentioned fourth terminal.

Figure 2B:
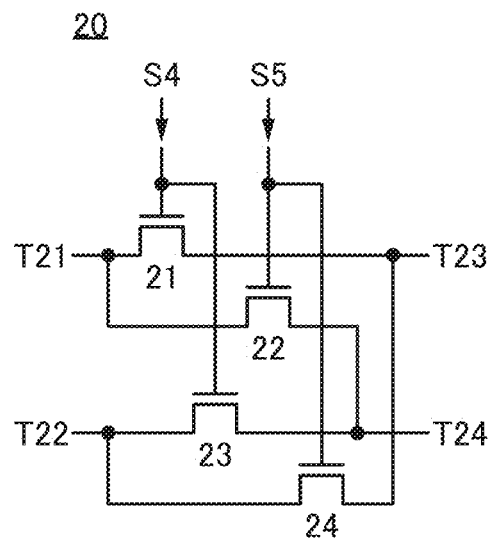
FIG. 2B is a circuit diagram showing a configuration example of the chopping circuit.

As shown in FIG. 2B, the chopping circuit 20 includes the transistor 21 to the transistor 24, the terminal T21 is electrically connected to one of a source and a drain of the transistor 21 and one of a source and a drain of the transistor 22, and the terminal T22 is electrically connected to one of a source and a drain of the transistor 23 and one of a source and a drain of the transistor 24. The terminal T23 is electrically connected to the other of the source and the drain of the transistor 21 and the other of the source and the drain of the transistor 24, and the terminal T24 is electrically connected to the other of the source and the drain of the transistor 23 and the other of the source and the drain of the transistor 22.

A signal S4 is input to a gate of the transistor 21 and a gate of the transistor 23, and a conduction state or a non-conduction state of each of the transistor 21 and the transistor 23 is controlled by the signal S4. A signal S5 is input to a gate of the transistor 22 and a gate of the transistor 24, and a conduction state or a non-conduction state of each of the transistor 22 and the transistor 24 is controlled by the signal S5.

The signal S5 is an inverted signal of the signal S4. When the signal S4 is at the high level, the signal S5 is at the low level; and when the signal S4 is at the low level, the signal S5 is at the high level. That is, when the signal S4 is at the high level, the terminal T21 and the terminal T23 are in a conduction state, and the terminal T22 and the terminal T24 are in a conduction state. When the signal S4 is at the low level, the terminal T21 and the terminal T24 are in a conduction state, and the terminal T22 and the terminal T23 are in a conduction state.

<Transistor 1>

OS transistors can be used as the transistor 11 to the transistor 13, and the transistor 21 to the transistor 24. An oxide semiconductor has a band gap of 2 eV or more and thus has a characteristic of an off-state current being extremely small. In an OS transistor, for example, a normalized off-state current per micrometer of channel width at a source-drain voltage of 10 V can be less than or equal to $10 \times 10^{-21}$ A (10 zeptoampere). Note that the details of the OS transistor will be described in Embodiment 2 and Embodiment 3.

An OS transistor has the following features. An OS transistor can be formed by a method such as a thin-film method, and thus can be provided over a semiconductor substrate. An off-state current of an OS transistor does not easily increase even under high temperature environments, so that the switch SW1 to the switch SW3 can be highly reliable switches, for example. OS transistors can be manufactured by using fabrication tools that are similar to those of transistors with silicon in a channel formation region, which enables OS transistors to be manufactured at low cost.

The transistor 11 to the transistor 13, and the transistor 21 to the transistor 24 may each have a back gate (also referred to as a second gate or a bottom gate). In the case where the transistor 11 has a back gate, for example, the threshold voltage of the transistor 11 can be increased and decreased by application of a predetermined potential to the back gate of the transistor 11. Alternatively, when the back gate of the transistor 11 is electrically connected to the gate (also referred to as a first gate, a top gate, or a front gate with respect to the back gate) of the transistor 11, the on-state current of the transistor 11 can be increased.

A metal oxide used in the channel formation region of an OS transistor is preferably an oxide containing one or more elements selected from In, Ga, Sn, and Zn. As such an oxide, an In—Sn—Ga—Zn oxide, an In—Ga—Zn oxide, an In—Sn—Zn oxide, an In—Al—Zn oxide, a Sn—Ga—Zn oxide, an Al—Ga—Zn oxide, a Sn—Al—Zn oxide, an In—Zn oxide, a Sn—Zn oxide, an Al—Zn oxide, a Zn—Mg oxide, a Sn—Mg oxide, an In—Mg oxide, an In—Ga oxide, an In oxide, a Sn oxide, a Zn oxide, or the like can be used.

Alternatively, as each of the transistor 11 to the transistor 13 and the transistor 21 to the transistor 24, a transistor other than an OS transistor may be used. The transistor 11 to the transistor 13 and the transistor 21 to the transistor 24 are each preferably a transistor with small off-state current, and for example, a transistor in which a semiconductor with a wide bandgap is included in a channel formation region can be used. The semiconductor with a wide bandgap refers to a semiconductor whose bandgap is larger than or equal to 2.2 eV in some cases, and examples thereof include silicon carbide, gallium nitride, and diamond.

<Configuration Example of Amplifier>

Figure 2C:
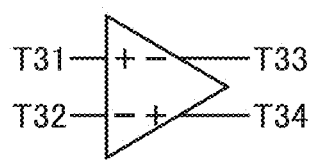
FIG. 2C is a diagram showing a symbol representing an amplifier.

The amplifier 30 can be formed using a transistor 31 to a transistor 39 and a transistor 41 to a transistor 44, for example. FIG. 2C is a diagram showing a symbol representing the amplifier 30, and FIG. 2D is a circuit diagram showing a configuration example of the amplifier 30.

In FIG. 2C and the like, four terminals of the amplifier 30 are referred to as a terminal T31 to a terminal T34. In the amplifier 30, the terminal T31 corresponds to the above-mentioned first terminal, the terminal T32 corresponds to the above-mentioned second terminal, the terminal T33 corresponds to the above-mentioned third terminal, and the terminal T34 corresponds to the above-mentioned fourth terminal. The terminal T31 can have a property of a non-inverting input terminal of the amplifier 30, the terminal T32 can have a property of an inverting input terminal of the amplifier 30, the terminal T33 can have a property of an inverting output terminal of the amplifier 30, and the terminal T34 can have a property of a non-inverting output terminal of the amplifier 30.

Figure 2D:
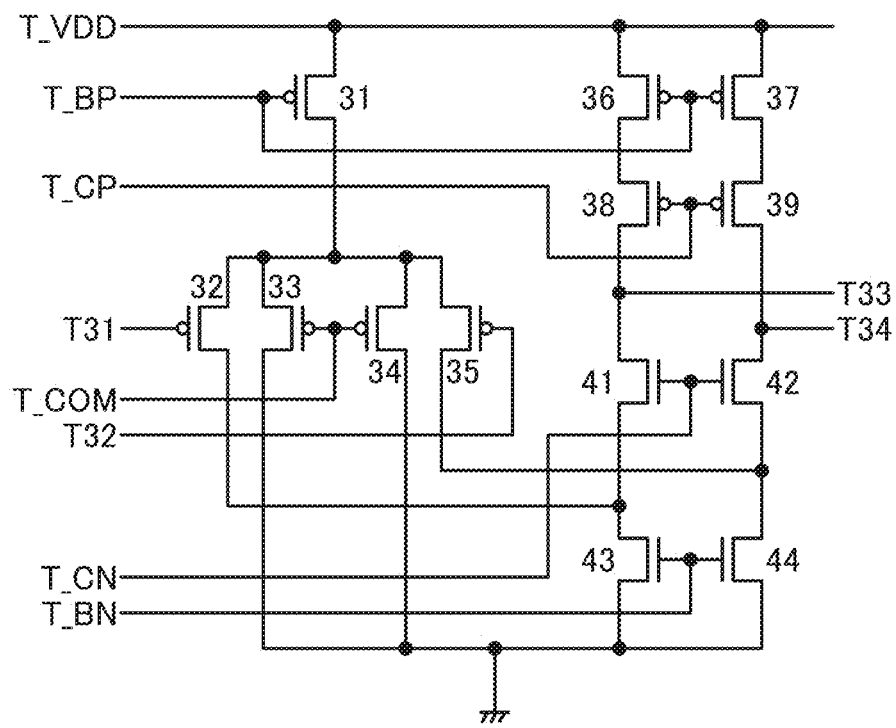
FIG. 2D is a circuit diagram showing a configuration example of the amplifier.

As shown in FIG. 2D, the amplifier 30 includes a terminal T_VDD, a terminal T_BP, a terminal T_CP, a terminal T_COM, a terminal T_CN, and a terminal T_BN.

As shown in FIG. 2D, the amplifier 30 includes the transistor 31 to the transistor 39 and the transistor 41 to the transistor 44; one of a source and a drain of the transistor 31 is electrically connected to the terminal T_VDD; and the other of the source and the drain of the transistor 31 is electrically connected to one of a source and a drain of the transistor 32, one of a source and a drain of the transistor 33, one of a source and a drain of the transistor 34, and one of a source and a drain of the transistor 35.

The other of the source and the drain of the transistor 32 is electrically connected to one of a source and a drain of the transistor 41 and one of a source and a drain of the transistor 43, and the other of the source and the drain of the transistor 33 is electrically connected to a wiring supplied with a reference potential. The other of the source and the drain of the transistor 34 is electrically connected to the wiring supplied with the reference potential, and the other of the source and the drain of the transistor 35 is electrically connected to one of a source and a drain of the transistor 42 and one of a source and a drain of the transistor 44.

One of a source and a drain of the transistor 36 and one of a source and a drain of the transistor 37 are electrically connected to the terminal T_VDD, the other of the source and the drain of the transistor 36 is electrically connected to one of a source and a drain of the transistor 38, and the other of the source and the drain of the transistor 37 is electrically connected to one of a source and a drain of the transistor 39. The other of the source and the drain of the transistor 38 is electrically connected to the terminal T33 and the other of the source and the drain of the transistor 41, the other of the source and the drain of the transistor 39 is electrically connected to the terminal T34 and the other of the source and the drain of the transistor 42, and the other of the source and the drain of the transistor 43 and the other of the source and the drain of the transistor 44 are electrically connected to the wiring supplied with the reference potential.

A gate of the transistor 31, a gate of the transistor 36, and a gate of the transistor 37 are electrically connected to the terminal T_BP; a gate of the transistor 38 and a gate of the transistor 39 are electrically connected to the terminal T_CP; a gate of the transistor 32 is electrically connected to the terminal T31; and a gate of the transistor 35 is electrically connected to the terminal T32. A gate of the transistor 33 and a gate of the transistor 34 are electrically connected to the terminal T_COM, a gate of the transistor 41 and a gate of the transistor 42 are electrically connected to the terminal T_CN, and a gate of the transistor 43 and a gate of the transistor 44 are electrically connected to the terminal T_BN.

A power supply potential VDD is input to the terminal T_VDD, and a bias potential that adjusts the operation of the amplifier 30 is input to each of the terminal T_BP, the terminal T_CP, the terminal T_COM, the terminal T_CN, and the terminal T_BN. A potential at the middle of potentials input to the terminal T31 and the terminal T32 is preferably input to the terminal T_COM, for example.

<Transistor 2>

Transistors formed on a semiconductor substrate can be used as the transistor 31 to the transistor 39 and the transistor 41 to the transistor 44. There is no particular limitation on the semiconductor substrate as long as a channel region of a transistor can be formed therein. For example, a single crystal silicon substrate, a single crystal germanium substrate, a compound semiconductor substrate (such as a SiC substrate or a GaN substrate), an SOI (Silicon on Insulator) substrate, or the like can be used.

As the SOI substrate, the following substrate may be used for example: an SIMOX (Separation by Implanted Oxygen) substrate which is formed in such a manner that after an oxygen ion is implanted into a mirror-polished wafer, an oxide layer is formed at a certain depth from the surface and defects generated in a surface layer are eliminated by high-temperature annealing; or an SOI substrate formed by using a method such as an ELTRAN method (a registered trademark: Epitaxial Layer Transfer) or a Smart-Cut method in which a semiconductor substrate is cleaved by utilizing growth of a minute void, which is formed by implantation of a hydrogen ion, by thermal treatment. A transistor formed using a single crystal substrate includes a single crystal semiconductor in a channel formation region.

In this embodiment, an example in which a single crystal silicon substrate is used as the semiconductor substrate will be described. A transistor formed on a single crystal silicon substrate is referred to as a "Si transistor". In the configuration example of the amplifier 30 shown in FIG. 2D, the transistor 31 to the transistor 39 are p-channel transistors, and the transistor 41 to the transistor 44 are n-channel transistors.

<Operation Example of Semiconductor Device>

Figure 3:
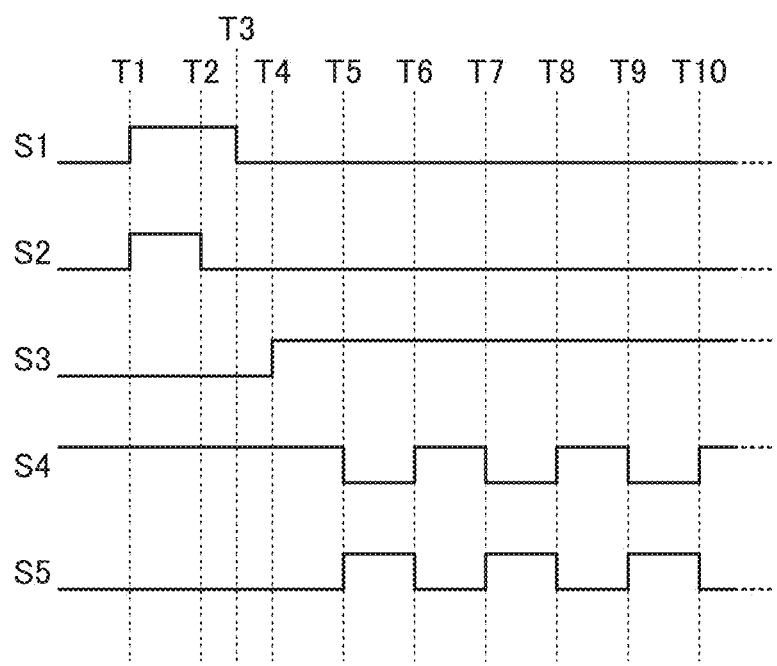
FIG. 3 is a timing chart showing an operation example of a semiconductor device.

FIG. 3 is a timing chart showing an operation example of the semiconductor device 100. The timing chart in FIG. 3 shows potential states (the high level or the low level) of the signal S1 to the signal S5 from Time T1 to Time T10.

At Time T1, the signal S1 and the signal S2 change from the low level to the high level. The signal S3 and the signal S5 stay at the low level, and the signal S4 stays at the high level. That is, the switch SW1 and the switch SW2 are in a conduction state, and the switch SW3 is in a non-conduction state. In a period from Time T1 to Time T2, sampling of the potentials input to the input terminal INP and the input terminal INM is performed.

With the sampling being performed, when a charge +Q11 is stored in the one terminal of the capacitor C11, a charge −Q11 is stored in the other terminal of the capacitor C11. In a similar manner, when a charge +Q12 is stored in the one terminal of the capacitor C12, a charge −Q12 is stored in the other terminal of the capacitor C12.

Figure 4A:
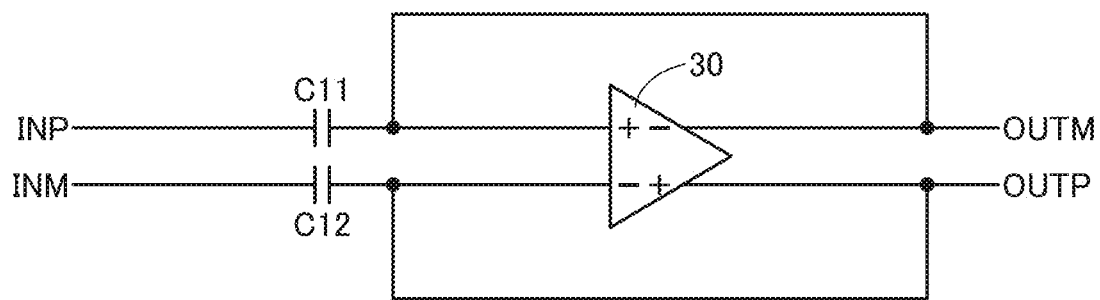
FIG. 4A to FIG. 4C are diagrams each showing an equivalent circuit of a semiconductor device.

In a period from Time T1 to Time T5, the first terminal and the third terminal of each of the chopping circuit 20_1 and the chopping circuit 20_2 are in a conduction state, and the second terminal and the fourth terminal of each of the chopping circuit 20_1 and the chopping circuit 20_2 are in a conduction state. FIG. 4A shows an equivalent circuit of the semiconductor device 100 in which the states of the switch SW1 to the switch SW3, the chopping circuit 20_1, and the chopping circuit 20_2 in the period from Time T1 to Time T2 are reflected.

In this state, the signal S2 changes from the high level to the low level at Time T2, thereby turning the switch SW2 into a non-conduction state. The signal S1 changes from the high level to the low level at Time T3, thereby turning the switch SW1 into a non-conduction state. With the switch SW1 and the switch SW2 brought into a non-conduction state, the capacitor C11 and the capacitor C12 turn into a floating state (an electrically floating state).

The signal S3 changes from the low level to the high level at Time T4, thereby turning the switch SW3 into a conduction state. At this time, the charge +Q11 remains stored in the one terminal of the capacitor C11, the charge −Q11 remains stored in the other terminal of the capacitor C11, the charge +Q12 remains stored in the one terminal of the capacitor C12, and the charge −Q12 remains stored in the other terminal of the capacitor C12. Thus, a difference obtained by subtracting a potential output to the output terminal OUTM from a potential output to the output terminal OUTP is equal to a difference obtained by subtracting a potential input to the input terminal INM from a potential input to the input terminal INP in a period from Time T1 to Time T2.

Figure 4B:
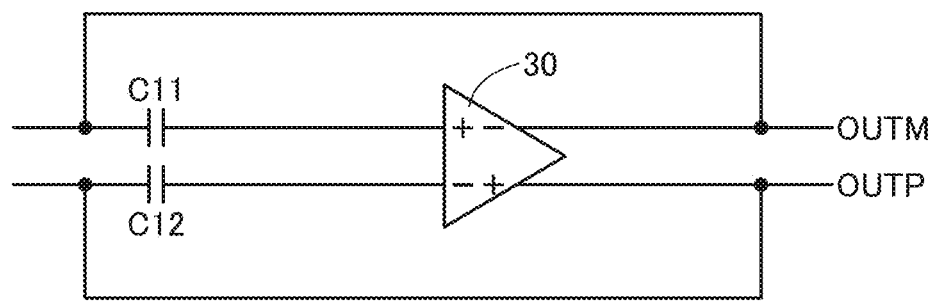

FIG. 4B shows an equivalent circuit of the semiconductor device 100 which reflects the states of the switch SW1 to the switch SW3, the chopping circuit 20_1, and the chopping circuit 20_2 in a period from Time T4 to Time T5.

In a period from Time T4 to Time T10, the switch SW1 and the switch SW2 are in a non-conduction state, and the switch SW3 is in a conduction state. The signal S4 changes from the high level to the low level and the signal S5 changes from the low level to the high level at Time T5. In other words, in a period from Time T5 to Time T6, the first terminal and the fourth terminal of each of the chopping circuit 20_1 and the chopping circuit 20_2 are in a conduction state, and the second terminal and the third terminal of each of the chopping circuit 20_1 and the chopping circuit 20_2 are in a conduction state.

Figure 4C:
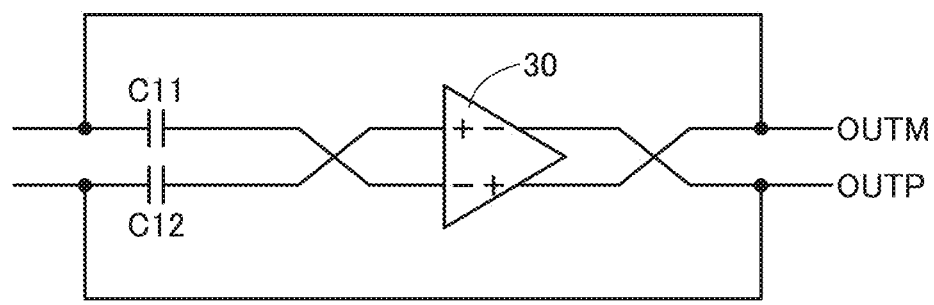

FIG. 4C shows an equivalent circuit of the semiconductor device 100 which reflects the states of the switch SW1 to the switch SW3, the chopping circuit 20_1, and the chopping circuit 20_2 in the period from Time T5 to Time T6.

In the period from Time T4 to Time T10, the states of the switch SW1 to the switch SW3 stay the same, and the states of the chopping circuit 20_1 and the chopping circuit 20_2 change. That is, in the period from Time T4 to Time T5, in a period from Time T6 to Time T7, and in a period from Time T8 to Time T9, the first terminal and the third terminal of each of the chopping circuit 20_1 and the chopping circuit 20_2 are in a conduction state and the second terminal and the fourth terminal of each of the chopping circuit 20_1 and the chopping circuit 20_2 are in a conduction state. The semiconductor device 100 has the state of the equivalent circuit shown in FIG. 4B.

In the period from Time T5 to Time T6, in a period from Time T7 to Time T8, and in a period from Time T9 to Time T10, the first terminal and the fourth terminal of each of the chopping circuit 20_1 and the chopping circuit 20_2 are in a conduction state and the second terminal and the third terminal of each of the chopping circuit 20_1 and the chopping circuit 20_2 are in a conduction state. The semiconductor device 100 has the state of the equivalent circuit shown in FIG. 4C.

<Semiconductor Device>

As described above, the semiconductor device 100 performs sampling of the potentials input to the input terminal INP and the input terminal INM in the period from Time T1 to Time T2, and outputs the potentials to the output terminal OUTP and the output terminal OUTM in the period from Time T4 to Time T10. At this time, a difference obtained by subtracting the potential output to the output terminal OUTM from the potential output to the output terminal OUTP is equal to a difference obtained from subtracting the potential input to the input terminal INM from the potential input to the input terminal INP.

In the period from Time T4 to Time T5, in the period from Time T6 to Time T7, and in the period from Time T8 to Time T9, the chopping circuit 20_1 electrically connects the other terminal of the capacitor C11 and the first terminal of the amplifier 30 (to be in a conduction state), and electrically connects the other terminal of the capacitor C12 and the second terminal of the amplifier 30. Similarly, the chopping circuit 20_2 electrically connects the third terminal of the amplifier 30 and the output terminal OUTM, and electrically connects the fourth terminal of the amplifier 30 and the output terminal OUTP (the state of the equivalent circuit shown in FIG. 4B).

In the period from Time T5 to Time T6, in the period from Time T7 to Time T8, and in the period from Time T9 to Time T10, the chopping circuit 20_1 electrically connects the other terminal of the capacitor C11 and the second terminal of the amplifier 30 (to be in a conduction state), and electrically connects the other terminal of the capacitor C12 and the first terminal of the amplifier 30. Similarly, the chopping circuit 20_2 electrically connects the third terminal of the amplifier 30 and the output terminal OUTP, and electrically connects the fourth terminal of the amplifier 30 and the output terminal OUTM (the state of the equivalent circuit shown in FIG. 4C).

In other words, the semiconductor device 100 alternately has the state of the equivalent circuit shown in FIG. 4B and the state of the equivalent circuit shown in FIG. 4C, enabling an effect of offset voltage attributable to the amplifier 30 to be canceled, for example. In addition, by replacing the polarities of the input terminals of the amplifier 30, for example, an effect of 1/f noise, thermal noise, or the like attributable to the amplifier 30 on an output can be reduced.

The semiconductor device 100, in which transistors with a small off-state current such as OS transistors are used as the transistor 11 to the transistor 13 and the transistor 21 to the transistor 24, can hold the potentials that are subjected to sampling in the period from Time T1 to Time T2 for a long time.

With the use of the semiconductor device 100, a highly accurate amplifier with a reduced effect of offset voltage or noise attributable to the amplifier 30 can be achieved, and the sampled potentials can be held for a long time; thus, the semiconductor device 100 is suitable for highly accurate measurement such as a sensor with high output impedance, for example.

Note that this embodiment can be implemented in appropriate combination with the other embodiments described in this specification.

Embodiment 2

In this embodiment, structure examples of the transistor included in the semiconductor device 100 described in the above embodiment will be described. This embodiment has a structure where a layer including an OS transistor is provided to be stacked above a layer including a Si transistor formed on a single crystal silicon substrate.

<Structure Example of Semiconductor Device>

Figure 5:
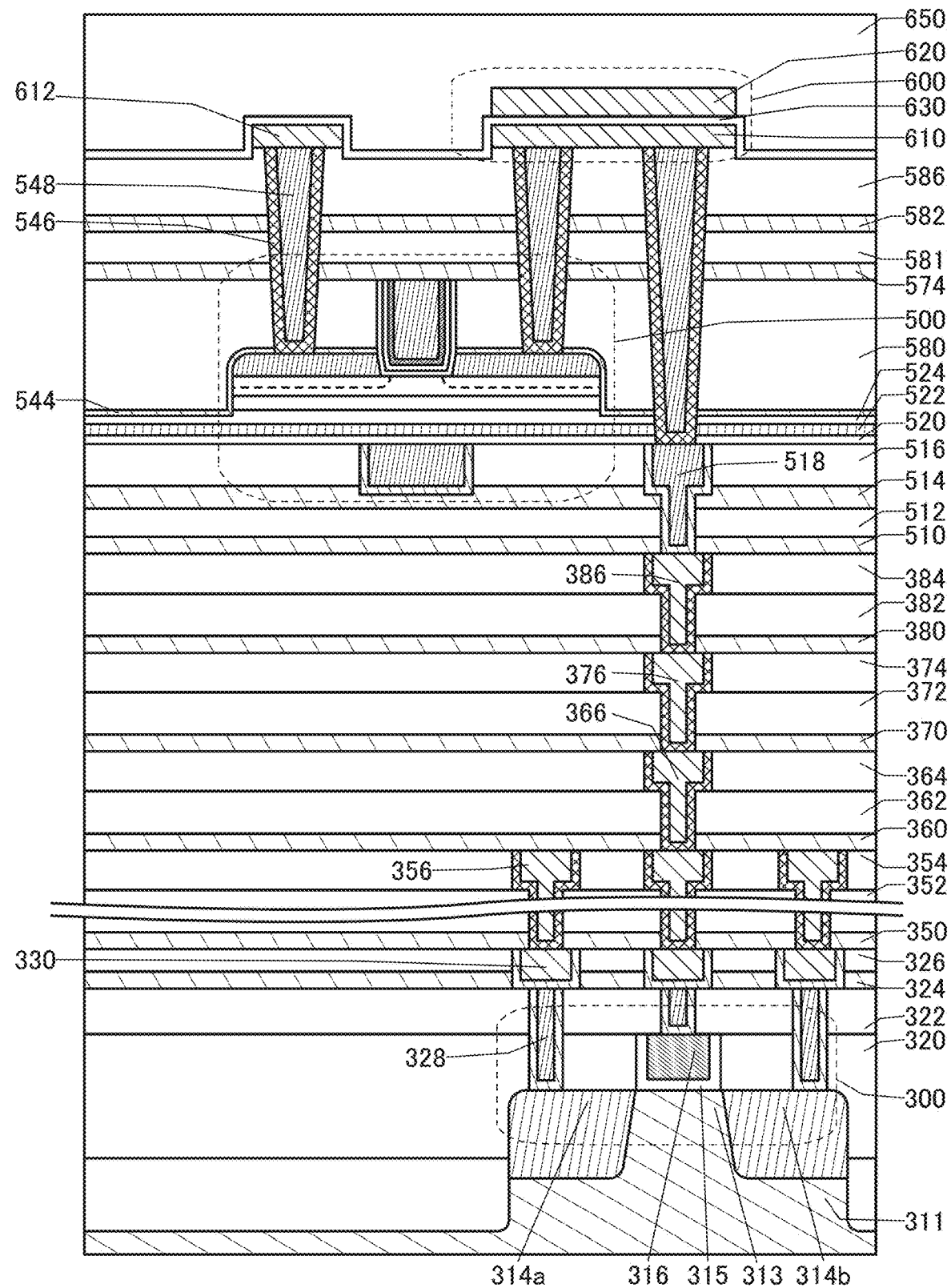
FIG. 5 is a cross-sectional view showing a structure example of a semiconductor device.
Figure 6A:
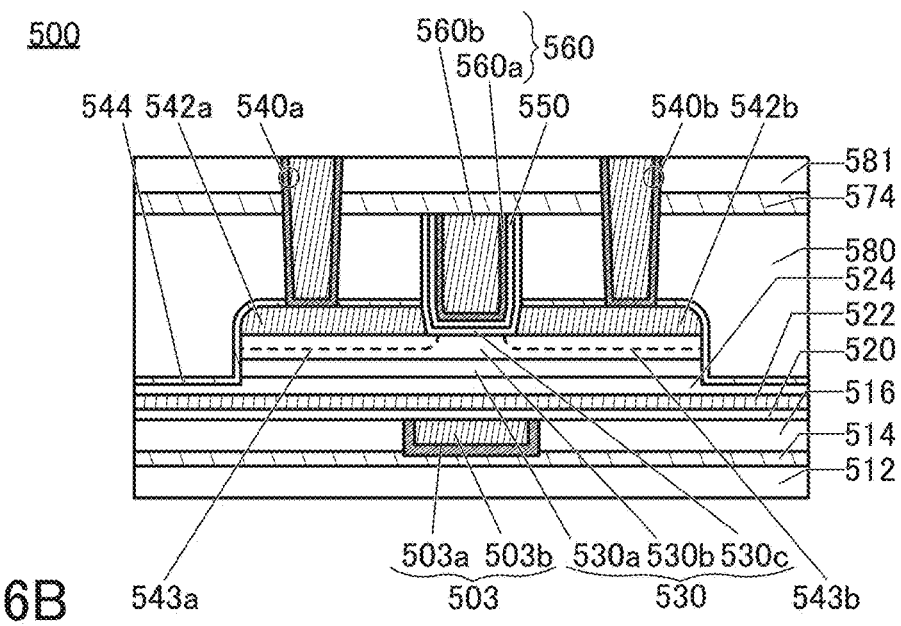
FIG. 6A to FIG. 6C are cross-sectional views showing a structure example of a transistor.
Figure 6B:
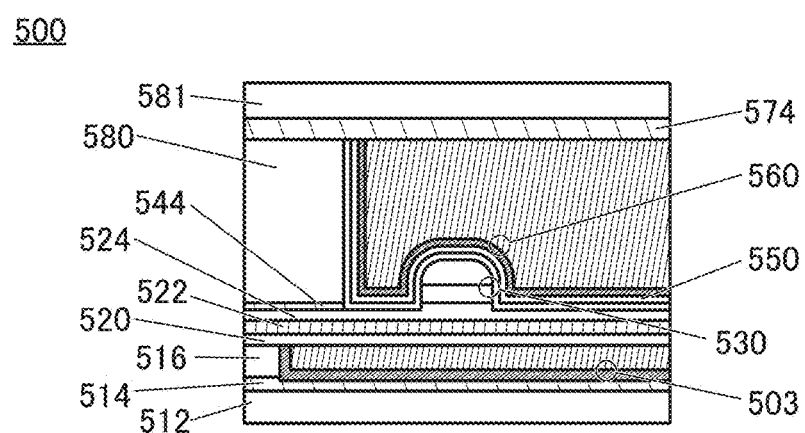
Figure 6C:
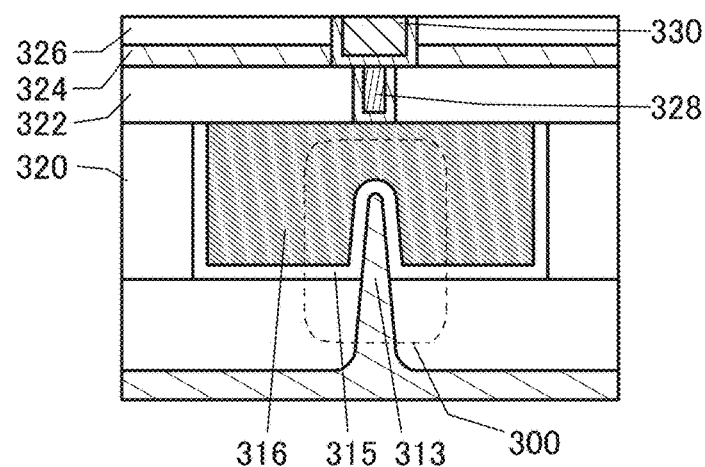

A semiconductor device shown in FIG. 5 includes a transistor 300, a transistor 500, and a capacitive element 600. FIG. 6A is a cross-sectional view of the transistor 500 in the channel length direction, FIG. 6B is a cross-sectional view of the transistor 500 in the channel width direction, and FIG. 6C is a cross-sectional view of the transistor 300 in the channel width direction.

For example, the transistor 500 corresponds to the transistor 21 described in the above embodiment, and the transistor 500 includes a second gate (also referred to as a bottom gate or a back gate) in addition to a first gate (also referred to as a top gate or a front gate). Furthermore, the transistor 300 corresponds to a Si transistor included in the amplifier 30, and the capacitive element 600 corresponds to, for example, the capacitor C11.

The transistor 500 is a transistor including a metal oxide in its channel-formation region (an OS transistor). The transistor 500 has an extremely small off-state current; in the above embodiment, the transistor 500 is used for the switch SW1 to the switch SW3 and the chopping circuit 20, enabling the semiconductor device 100 to hold the sampled potential for a long time.

As shown in FIG. 5, in the semiconductor device described in this embodiment, the transistor 500 is provided above the transistor 300, and the capacitive element 600 is provided above the transistor 300 and the transistor 500.

The transistor 300 is provided on a substrate 311 and includes a conductor 316, an insulator 315, a semiconductor region 313 that is a part of the substrate 311, and a low-resistance region 314a and a low-resistance region 314b functioning as a source region and a drain region.

As shown in FIG. 6C, in the transistor 300, a top surface and a side surface in the channel width direction of the semiconductor region 313 are covered with the conductor 316 with the insulator 315 therebetween. Such a Fin-type transistor 300 can have an increased effective channel width, and thus the transistor 300 can have improved on-state characteristics. In addition, since contribution of an electric field of a gate electrode can be increased, the off-state characteristics of the transistor 300 can be improved.

Note that the transistor 300 can be either a p-channel transistor or an n-channel transistor.

It is preferable that a region of the semiconductor region 313 where a channel is formed, a region in the vicinity thereof, the low-resistance region 314a and the low-resistance region 314b functioning as the source region and the drain region, and the like contain a semiconductor such as a silicon-based semiconductor, further preferably single crystal silicon. Alternatively, these regions may be formed using a material containing Ge (germanium), SiGe (silicon germanium), GaAs (gallium arsenide), GaAlAs (gallium aluminum arsenide), or the like. A structure using silicon whose effective mass is controlled by applying stress to the crystal lattice and changing the lattice spacing may be employed. Alternatively, the transistor 300 may be an HEMT (High Electron Mobility Transistor) with GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to the semiconductor material used for the semiconductor region 313.

The conductor 316 functioning as a gate electrode can be formed using a semiconductor material such as silicon containing an element that imparts n-type conductivity, such as arsenic or phosphorus, or an element that imparts p-type conductivity, such as boron, or using a conductive material such as a metal material, an alloy material, or a metal oxide material.

Note that since the work function of a conductor depends on a material of the conductor, Vth of the transistor can be adjusted by changing the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Note that the transistor 300 shown in FIG. 5 is an example and is not limited to the structure shown therein; an appropriate transistor is used in accordance with a circuit structure or a driving method.

An insulator 320, an insulator 322, an insulator 324, and an insulator 326 are stacked in this order to cover the transistor 300.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, or aluminum nitride.

The insulator 322 may have a function of a planarization film for planarizing a level difference caused by the transistor 300 or the like provided below the insulator 322. For example, the top surface of the insulator 322 may be planarized by planarization treatment using a chemical mechanical polishing (CMP) method or the like to improve planarity.

The insulator 324 is preferably formed using a film having a barrier property that prevents diffusion of hydrogen or impurities from the substrate 311, the transistor 300, or the like into the region where the transistor 500 is provided.

For the film having a barrier property against hydrogen, silicon nitride formed by a CVD method can be used, for example. Here, diffusion of hydrogen to a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

The amount of released hydrogen can be measured by thermal desorption spectroscopy (TDS), for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the dielectric constant of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less the dielectric constant of the insulator 324. When a material with a low dielectric constant is used for an interlayer film, the parasitic capacitance generated between wirings can be reduced.

A conductor 328, a conductor 330, and the like that are connected to the capacitive element 600 or the transistor 500 are embedded in the insulator 320, the insulator 322, the insulator 324, and the insulator 326. Note that the conductor 328 and the conductor 330 have a function of a plug or a wiring. A plurality of conductors functioning as plugs or wirings are collectively denoted by the same reference numeral in some cases. Moreover, in this specification and the like, a wiring and a plug connected to the wiring may be a single component. That is, there are cases where a part of a conductor functions as a wiring and another part of the conductor functions as a plug.

As a material for each of plugs and wirings (the conductor 328, the conductor 330, and the like), a single layer or stacked layers of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to use a low-resistance conductive material such as aluminum or copper. The use of a low-resistance conductive material can reduce wiring resistance.

A wiring layer may be provided over the insulator 326 and the conductor 330. For example, in FIG. 5, an insulator 350, an insulator 352, and an insulator 354 are provided to be stacked in this order. Furthermore, a conductor 356 is formed in the insulator 350, the insulator 352, and the insulator 354. The conductor 356 has a function of a plug or a wiring that is connected to the transistor 300. Note that the conductor 356 can be provided using a material similar to that for the conductor 328 and the conductor 330.

For example, like the insulator 324, the insulator 350 is preferably formed using an insulator having a barrier property against hydrogen. The conductor 356 preferably contains a conductor having a barrier property against hydrogen. In particular, the conductor having a barrier property against hydrogen is formed in an opening portion of the insulator 350 having a barrier property against hydrogen. With this structure, the transistor 300 and the transistor 500 can be separated by the barrier layer, so that diffusion of hydrogen from the transistor 300 into the transistor 500 can be inhibited.

For the conductor having a barrier property against hydrogen, tantalum nitride is preferably used, for example. In addition, the use of a stack including tantalum nitride and tungsten, which has high conductivity, can inhibit diffusion of hydrogen from the transistor 300 while the conductivity of a wiring is maintained. In that case, a structure is preferable in which a tantalum nitride layer having a barrier property against hydrogen is in contact with the insulator 350 having a barrier property against hydrogen.

A wiring layer may be provided over the insulator 354 and the conductor 356. For example, in FIG. 5, an insulator 360, an insulator 362, and an insulator 364 are provided to be stacked in this order. Furthermore, a conductor 366 is formed in the insulator 360, the insulator 362, and the insulator 364. The conductor 366 has a function of a plug or a wiring. Note that the conductor 366 can be provided using a material similar to that for the conductor 328 and the conductor 330.

For example, like the insulator 324, the insulator 360 is preferably formed using an insulator having a barrier property against hydrogen. Furthermore, the conductor 366 preferably contains a conductor having a barrier property against hydrogen. In particular, the conductor having a barrier property against hydrogen is formed in an opening portion of the insulator 360 having a barrier property against hydrogen. With this structure, the transistor 300 and the transistor 500 can be separated by the barrier layer, so that diffusion of hydrogen from the transistor 300 into the transistor 500 can be inhibited.

A wiring layer may be provided over the insulator 364 and the conductor 366. For example, in FIG. 5, an insulator 370, an insulator 372, and an insulator 374 are provided to be stacked in this order. Furthermore, a conductor 376 is formed in the insulator 370, the insulator 372, and the insulator 374. The conductor 376 has a function of a plug or a wiring. Note that the conductor 376 can be provided using a material similar to the materials for the conductor 328 and the conductor 330.

For example, like the insulator 324, the insulator 370 is preferably formed using an insulator having a barrier property against hydrogen. Furthermore, the conductor 376 preferably contains a conductor having a barrier property against hydrogen. In particular, the conductor having a barrier property against hydrogen is formed in an opening portion of the insulator 370 having a barrier property against hydrogen. With this structure, the transistor 300 and the transistor 500 can be separated by the barrier layer, so that diffusion of hydrogen from the transistor 300 into the transistor 500 can be inhibited.

A wiring layer may be provided over the insulator 374 and the conductor 376. For example, in FIG. 5, an insulator 380, an insulator 382, and an insulator 384 are provided to be stacked in this order. Furthermore, a conductor 386 is formed in the insulator 380, the insulator 382, and the insulator 384. The conductor 386 has a function of a plug or a wiring. Note that the conductor 386 can be provided using a material similar to the materials for the conductor 328 and the conductor 330.

For example, like the insulator 324, the insulator 380 is preferably formed using an insulator having a barrier property against hydrogen. Furthermore, the conductor 386 preferably contains a conductor having a barrier property against hydrogen. In particular, the conductor having a barrier property against hydrogen is formed in an opening portion of the insulator 380 having a barrier property against hydrogen. With this structure, the transistor 300 and the transistor 500 can be separated by the barrier layer, so that diffusion of hydrogen from the transistor 300 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are provided to be stacked in this order over the insulator 384. A substance having a barrier property against oxygen or hydrogen is preferably used for any of the insulator 510, the insulator 512, the insulator 514, and the insulator 516.

The insulator 510 and the insulator 514 are preferably formed using, for example, a film having a barrier property that prevents diffusion of hydrogen or impurities from the substrate 311, the region where the transistor 300 is provided, or the like into the region where the transistor 500 is provided. Thus, a material similar to that for the insulator 324 can be used.

For the film having a barrier property against hydrogen, silicon nitride formed by a CVD method can be used, for example. Here, diffusion of hydrogen to a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

For the film having a barrier property against hydrogen used as the insulator 510 and the insulator 514, for example, a metal oxide such as aluminum oxide, hafnium oxide, or tantalum oxide is preferably used.

In particular, aluminum oxide has a high blocking effect that inhibits the passage of both oxygen and impurities such as hydrogen and moisture which are factors of a change in electrical characteristics of the transistor. Thus, aluminum oxide can prevent the entry of impurities such as hydrogen and moisture into the transistor 500 in the fabrication process and after the fabrication of the transistor. In addition, release of oxygen from the oxide included in the transistor 500 can be inhibited. Therefore, aluminum oxide is suitably used for a protective film of the transistor 500.

The insulator 512 and the insulator 516 can be formed using a material similar to that for the insulator 320, for example. When a material with a relatively low permittivity is used for the interlayer film, the parasitic capacitance between wirings can be reduced. Silicon oxide films, silicon oxynitride films, or the like can be used as the insulator 512 and the insulator 516, for example.

A conductor 518, a conductor included in the transistor 500 (a conductor 503), and the like are embedded in the insulator 510, the insulator 512, the insulator 514, and the insulator 516. Note that the conductor 518 has a function of a plug or a wiring that is connected to the capacitive element 600 or the transistor 300. The conductor 518 can be provided using a material similar to the materials for the conductor 328 and the conductor 330.

In particular, the conductor 518 in a region in contact with the insulator 510 and the insulator 514 is preferably a conductor having a barrier property against oxygen, hydrogen, and water. With this structure, the transistor 300 and the transistor 500 can be separated by the layer having a barrier property against oxygen, hydrogen, and water; thus, the diffusion of hydrogen from the transistor 300 into the transistor 500 can be inhibited.

The transistor 500 is provided above the insulator 516.

As shown in FIG. 6A and FIG. 6B, the transistor 500 includes the conductor 503 positioned to be embedded in the insulator 514 and the insulator 516; an insulator 520 positioned over the insulator 516 and the conductor 503; an insulator 522 positioned over the insulator 520; an insulator 524 positioned over the insulator 522; an oxide 530a positioned over the insulator 524; an oxide 530b positioned over the oxide 530a; a conductor 542a and a conductor 542b positioned apart from each other over the oxide 530b; an insulator 580 that is positioned over the conductor 542a and the conductor 542b and is provided with an opening formed to overlap with a region between the conductor 542a and the conductor 542b; a conductor 560 positioned in the opening; an insulator 550 positioned between the conductor 560 and the oxide 530b, the conductor 542a, the conductor 542b, and the insulator 580; and an oxide 530c positioned between the insulator 550 and the oxide 530b, the conductor 542a, the conductor 542b, and the insulator 580.

As shown in FIG. 6A and FIG. 6B, an insulator 544 is preferably positioned between the insulator 580 and the oxide 530a, the oxide 530b, the conductor 542a, and the conductor 542b. In addition, as shown in FIG. 6A and FIG. 6B, the conductor 560 preferably includes a conductor 560a provided inside the insulator 550 and a conductor 560b provided to be embedded inside the conductor 560a. As shown in FIG. 6A and FIG. 6B, an insulator 574 is preferably positioned over the insulator 580, the conductor 560, and the insulator 550.

Hereinafter, the oxide 530a, the oxide 530b, and the oxide 530c may be collectively referred to as an oxide 530. The conductor 542a and the conductor 542b may be collectively referred to as a conductor 542.

Note that the transistor 500 having a structure in which three layers of the oxide 530a, the oxide 530b, and the oxide 530c are stacked in the region where the channel is formed and its vicinity is illustrated; however, the present invention is not limited thereto. For example, a single layer of the oxide 530b, a two-layer structure of the oxide 530b and the oxide 530a, a two-layer structure of the oxide 530b and the oxide 530c, or a stacked-layer structure of four or more layers may be employed. Furthermore, although the conductor 560 having a stacked-layer structure of two layers in the transistor 500 is illustrated, the present invention is not limited thereto. For example, the conductor 560 may have a single-layer structure or a stacked-layer structure of three or more layers. The transistor 500 shown in FIG. 5, FIG. 6A, and FIG. 6B is an example, and the structure is not limited thereto; an appropriate transistor can be used in accordance with a circuit structure or a driving method.

Here, the conductor 560 functions as a gate electrode of the transistor, and the conductor 542a and the conductor 542b function as a source electrode and a drain electrode. As described above, the conductor 560 is formed to be embedded in the opening of the insulator 580 and the region between the conductor 542a and the conductor 542b. The positions of the conductor 560, the conductor 542a, and the conductor 542b are selected in a self-aligned manner with respect to the opening of the insulator 580. That is, in the transistor 500, the gate electrode can be positioned between the source electrode and the drain electrode in a self-aligned manner. Thus, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542a and the conductor 542b in a self-aligned manner, the conductor 560 does not include a region overlapping with the conductor 542a or the conductor 542b. Thus, parasitic capacitance formed between the conductor 560 and each of the conductor 542a and the conductor 542b can be reduced. As a result, the switching speed of the transistor 500 can be improved, and the transistor 500 can have high frequency characteristics.

The conductor 560 sometimes functions as a first gate electrode. In addition, the conductor 503 sometimes functions as a second gate electrode. In that case, Vth of the transistor 500 can be controlled by changing a potential applied to the conductor 503 independently of a potential applied to the conductor 560. In particular, Vth of the transistor 500 can be higher than 0 V and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to overlap with the oxide 530 and the conductor 560. Thus, when potentials are applied to the conductor 560 and the conductor 503, an electric field generated from the conductor 560 and an electric field generated from the conductor 503 are connected, so that the channel-formation region formed in the oxide 530 can be covered. In this specification and the like, a transistor structure in which a channel-formation region is electrically surrounded by electric fields of a first gate electrode and a second gate electrode is referred to as a surrounded channel (S-channel) structure.

Furthermore, in this specification and the like, the S-channel structure has a feature that the side surface and the vicinity of the oxide 530 in contact with the conductor 542a and the conductor 542b functioning as the source electrode and the drain electrode are of i-type like the channel-formation region. The side surface and the vicinity of the oxide 530 in contact with the conductor 542a and the conductor 542b are in contact with the insulator 544 and thus can be of i-type like the channel-formation region. Note that in this specification and the like, "i-type" can be equated with "highly purified intrinsic" to be described later. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

The conductor 503 has a structure similar to that of the conductor 518; a conductor 503a is formed in contact with an inner wall of an opening in the insulator 514 and the insulator 516, and a conductor 503b is formed on the inner side.

The insulator 520, the insulator 522, the insulator 524, and the insulator 550 each have a function of a gate insulating film.

Here, as the insulator 524 in contact with the oxide 530, an insulator that contains oxygen more than oxygen in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced and the reliability of the transistor 500 can be improved.

As the insulator including an excess-oxygen region, specifically, an oxide material from which part of oxygen is released by heating is preferably used. An oxide from which oxygen is released by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably within the range of 100° C. to 700° C., or 100° C. to 400° C.

When the insulator 524 includes an excess-oxygen region, it is preferable that the insulator 522 have a function of inhibiting diffusion of oxygen (e.g., oxygen atoms and oxygen molecules) (or that the above oxygen be less likely to pass through the insulator 522).

When the insulator 522 has a function of inhibiting diffusion of oxygen or impurities, oxygen contained in the oxide 530 is not diffused to the insulator 520 side, which is preferable. Furthermore, the conductor 503 can be inhibited from reacting with oxygen contained in the insulator 524 or the oxide 530.

For example, the insulator 522 is preferably formed using a single layer or stacked layers of an insulator containing aluminum oxide, hafnium oxide, tantalum oxide, zirconium oxide, lead zirconate titanate (PZT), strontium titanate (SrTiO$_3$), (Ba,Sr)TiO$_3$ (BST), or the like. With miniaturization and high integration of transistors, a problem such as leakage current may arise because of a thinner gate insulating film. When a high-k material is used for the insulator functioning as the gate insulating film, a gate potential at the time when the transistor operates can be reduced while the physical thickness is maintained.

It is particularly preferable to use an insulator containing an oxide of one or both of aluminum and hafnium, which is an insulating material having a function of inhibiting diffusion of impurities, oxygen, and the like (through which the above oxygen is less likely to pass). As the insulator containing an oxide of one or both of aluminum and hafnium, aluminum oxide, hafnium oxide, an oxide containing aluminum and hafnium (hafnium aluminate), or the like is preferably used. In the case where the insulator 522 is formed using such a material, the insulator 522 functions as a layer that inhibits release of oxygen from the oxide 530 and mixing of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

It is preferable that the insulator 520 be thermally stable. For example, silicon oxide and silicon oxynitride, which have thermal stability, are preferable. Furthermore, when an insulator that is a high-k material is combined with silicon oxide or silicon oxynitride, the insulator 520 having a stacked-layer structure that has thermal stability and a high dielectric constant can be obtained.

Note that the insulator 520, the insulator 522, and the insulator 524 may each have a stacked-layer structure of two or more layers. In such cases, without limitation to a stacked-layer structure formed of the same material, a stacked-layer structure formed of different materials may be employed.

In the transistor 500, a metal oxide functioning as an oxide semiconductor is preferably used as the oxide 530 including the channel-formation region. For example, as the oxide 530, a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. Furthermore, as the oxide 530, an In—Ga oxide or an In—Zn oxide may be used.

Note that the metal oxide functioning as an oxide semiconductor may be formed by a sputtering method or an ALD (Atomic Layer Deposition) method. The metal oxide functioning as an oxide semiconductor will be described in another embodiment.

Furthermore, a metal oxide with a low carrier density is preferably used in the transistor 500. In order to reduce the carrier density of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. Examples of impurities in a metal oxide include hydrogen, nitrogen, alkali metal, alkaline earth metal, iron, nickel, and silicon.

In particular, hydrogen contained in a metal oxide reacts with oxygen bonded to a metal atom to be water, and thus forms oxygen vacancies in the metal oxide in some cases. If the channel-formation region in the metal oxide includes oxygen vacancies, the transistor sometimes has normally-on characteristics. In some cases, a defect that is an oxygen vacancy into which hydrogen has entered functions as a donor and generates an electron serving as a carrier. In other cases, bonding of part of hydrogen to oxygen bonded to a metal atom generates electrons serving as carriers. Thus, a transistor using a metal oxide containing a large amount of hydrogen is likely to have normally-on characteristics.

A defect that is an oxygen vacancy into which hydrogen has entered can function as a donor of a metal oxide. However, it is difficult to evaluate the defects quantitatively. Thus, the metal oxide is sometimes evaluated by not its donor concentration but its carrier density. Therefore, in this specification and the like, as the parameter of the metal oxide, the carrier density assuming the state where an electric field is not applied is sometimes used instead of the donor concentration. That is, "carrier density" in this specification and the like can be replaced with "donor concentration" in some cases.

Consequently, when a metal oxide is used for the oxide 530, hydrogen in the metal oxide is preferably reduced as much as possible. Specifically, the hydrogen concentration of the metal oxide, which is measured by secondary ion mass spectrometry (SIMS), is lower than $1 \times 10^{20}$ atoms/cm$^3$, preferably lower than $1 \times 10^{19}$ atoms/cm$^3$, further preferably lower than $5 \times 10^{18}$ atoms/cm$^3$, and still further preferably lower than $1 \times 10^{18}$ atoms/cm$^3$. When a metal oxide with a sufficiently low concentration of impurities such as hydrogen is used for a channel-formation region of a transistor, the transistor can have stable electrical characteristics.

When a metal oxide is used for the oxide 530, the carrier density of the metal oxide in the channel-formation region is preferably lower than or equal to $1 \times 10^{18}$ cm$^{-3}$, further preferably lower than $1 \times 10^{17}$ cm$^{-3}$, still further preferably lower than $1 \times 10^{16}$ cm$^{-3}$, yet further preferably lower than $1 \times 10^{13}$ cm$^{-3}$, and yet still further preferably lower than $1 \times 10^{12}$ cm$^{-3}$. Note that the lower limit of the carrier density of the metal oxide in the channel-formation region is not particularly limited and can be, for example, $1 \times 10^{-9}$ cm$^{-3}$.

When a metal oxide is used for the oxide 530, contact between the conductor 542 (the conductor 542a and the conductor 542b) and the oxide 530 may make oxygen in the oxide 530 diffuse into the conductor 542, resulting in oxidation of the conductor 542. It is highly possible that oxidation of the conductor 542 lowers the conductivity of the conductor 542. Note that diffusion of oxygen in the oxide 530 into the conductor 542 can be interpreted as absorption of oxygen in the oxide 530 by the conductor 542.

When oxygen in the oxide 530 is diffused into the conductor 542 (the conductor 542a and the conductor 542b), a layer is sometimes formed between the conductor 542a and the oxide 530b, and between the conductor 542b and the oxide 530b. The layer contains more oxygen than the conductor 542 does, and thus presumably has an insulating property. In this case, a three-layer structure of the conductor 542, the layer, and the oxide 530b can be regarded as a three-layer structure of a metal, an insulator, and a semiconductor and is sometimes referred to as a MIS (Metal-Insulator-Semiconductor) structure or a diode junction structure having an MIS structure as its main part.

The above layer is not necessarily formed between the conductor 542 and the oxide 530b, but the layer may be formed between the conductor 542 and the oxide 530c, or formed between the conductor 542 and the oxide 530b and between the conductor 542 and the oxide 530c.

The metal oxide functioning as the channel-formation region in the oxide 530 has a bandgap of preferably 2 eV or larger, further preferably 2.5 eV or larger. With the use of a metal oxide having such a wide bandgap, the off-state current of the transistor can be reduced.

Semiconductor materials that can be used for the oxide 530 are not limited to the above metal oxides. A semiconductor material having a bandgap (a semiconductor material that is not a zero-gap semiconductor) can be used for the oxide 530. For example, a single element semiconductor such as silicon, a compound semiconductor such as gallium arsenide, or a layered material (also referred to as an atomic layered material or a two-dimensional material) is preferably used as a semiconductor material. In particular, a layered material functioning as a semiconductor is preferably used as a semiconductor material.

Here, in this specification and the like, the layered material is a general term of a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material functioning as a semiconductor and having high two-dimensional electrical conductivity is used for a channel-formation region, a transistor having a high on-state current can be provided.

Examples of the layered material include graphene, silicene, and chalcogenide. Chalcogenide is a compound containing chalcogen. Chalcogen is a general term of elements belonging to Group 16, which includes oxygen, sulfur, selenium, tellurium, polonium, and livermorium. Examples of chalcogenide include transition metal chalcogenide and chalcogenide of Group 13 elements.

As the oxide 530, a transition metal chalcogenide functioning as a semiconductor is preferably used, for example. Specific examples of the transition metal chalcogenide which can be used for the oxide 530 include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically $HfS_2$), hafnium selenide (typically $HfSe_2$), zirconium sulfide (typically $ZrS_2$), and zirconium selenide (typically $ZrSe_2$).

When the oxide 530 includes the oxide 530a under the oxide 530b, it is possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c.

Note that the oxide 530 preferably has a stacked-layer structure of a plurality of oxide layers that differ in the atomic ratio of metal atoms. Specifically, the atomic proportion of the element M in the constituent elements in the metal oxide used as the oxide 530a is preferably higher than the atomic proportion of the element M in the constituent elements in the metal oxide used as the oxide 530b. In addition, the atomic ratio of the element M to In in the metal oxide used as the oxide 530a is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530a. A metal oxide that can be used as the oxide 530a or the oxide 530b can be used as the oxide 530c.

The energy of the conduction band minimum of each of the oxide 530a and the oxide 530c is preferably higher than the energy of the conduction band minimum of the oxide 530b.

In other words, the electron affinity of each of the oxide 530a and the oxide 530c is preferably smaller than the electron affinity of the oxide 530b.

The energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To obtain this, the density of defect states in a mixed layer formed at the interface between the oxide 530a and the oxide 530b and the interface between the oxide 530b and the oxide 530c is preferably made low.

Specifically, when the oxide 530a and the oxide 530b or the oxide 530b and the oxide 530c contain a common element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is preferably used as the oxide 530a and the oxide 530c.

At this time, the oxide 530b serves as a main carrier path. When the oxide 530a and the oxide 530c have the above structure, the density of defect states at the interface between the oxide 530a and the oxide 530b and the interface between the oxide 530b and the oxide 530c can be made low. Thus, the influence of interface scattering on carrier conduction is small, and the transistor 500 can have a high on-state current.

The conductor 542 (the conductor 542a and the conductor 542b) functioning as the source electrode and the drain electrode is provided over the oxide 530b. For the conductor 542, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

As shown in FIG. 6A, a region 543 (a region 543a and a region 543b) is sometimes formed as a low-resistance region at and near the interface between the oxide 530 and the conductor 542. In that case, the region 543a functions as one of a source region and a drain region, and the region 543b functions as the other of the source region and the drain region. Furthermore, the channel-formation region is formed in a region between the region 543a and the region 543b.

When the conductor 542 is provided in contact with the oxide 530, the oxygen concentration in the region 543 sometimes decreases. In addition, a metal compound layer that contains the metal contained in the conductor 542 and the component of the oxide 530 is sometimes formed in the region 543. In such a case, the carrier density of the region 543 increases, and the region 543 becomes a low-resistance region.

The insulator 544 is provided to cover the conductor 542 and inhibits oxidation of the conductor 542. At this time, the insulator 544 may be provided to cover a side surface of the oxide 530 and to be in contact with the insulator 524.

A metal oxide containing one or more kinds selected from hafnium, aluminum, gallium, yttrium, zirconium, tungsten, titanium, tantalum, nickel, germanium, magnesium, and the like can be used as the insulator 544.

For the insulator 544, it is particularly preferable to use an insulator containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542 is an oxidation-resistant material or does not significantly lose its conductivity even after absorbing oxygen. Design is appropriately set in consideration of required transistor characteristics.

The insulator 550 functions as a gate insulating film. The insulator 550 is preferably positioned in contact with the inner side (the top surface and the side surface) of the oxide 530c. The insulator 550 is preferably formed using an insulator from which oxygen is released by heating. For example, the insulator 550 is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS analysis. Note that the temperature of the film surface in the TDS analysis is preferably within the range of 100° C. to 700° C.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used. In particular, silicon oxide and silicon oxynitride, which have thermal stability, are preferable.

When an insulator from which oxygen is released by heating is provided as the insulator 550 in contact with the top surface of the oxide 530c, oxygen can be effectively supplied from the insulator 550 to the channel-formation region of the oxide 530b through the oxide 530c. Furthermore, as in the insulator 524, the concentration of impurities such as water or hydrogen in the insulator 550 is preferably reduced. The thickness of the insulator 550 is preferably greater than or equal to 1 nm and less than or equal to 20 nm.

To efficiently supply excess oxygen contained in the insulator 550 to the oxide 530, a metal oxide may be provided between the insulator 550 and the conductor 560. The metal oxide preferably inhibits diffusion of oxygen from the insulator 550 into the conductor 560. Providing the metal oxide that inhibits diffusion of oxygen inhibits diffusion of excess oxygen from the insulator 550 into the conductor 560. That is, a reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Although the conductor 560 functioning as the first gate electrode has a two-layer structure in FIG. 6A and FIG. 6B, the conductor 560 may have a single-layer structure or a stacked-layer structure of three or more layers.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 560a has a function of inhibiting diffusion of oxygen, it is possible to inhibit a reduction in conductivity of the conductor 560b due to oxidation caused by oxygen contained in the insulator 550. As a conductive material having a function of inhibiting diffusion of oxygen, for example, tantalum, tantalum nitride, ruthenium, ruthenium oxide, or the like is preferably used.

The conductor 560b is preferably formed using a conductive material containing tungsten, copper, or aluminum as its main component. Furthermore, the conductor 560b also functions as a wiring and thus is preferably a conductor having high conductivity. For example, a conductive material containing tungsten, copper, or aluminum as its main component can be used. The conductor 560b can have a stacked-layer structure, for example, a stacked-layer structure of any of the above conductive materials and titanium or titanium nitride.

The insulator 580 is provided over the conductor 542 with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride, which have thermal stability, are preferable. In particular, silicon oxide and porous silicon oxide are preferable because an excess-oxygen region can be easily formed in a later step.

When the insulator 580 from which oxygen is released by heating is provided in contact with the oxide 530c, oxygen in the insulator 580 can be efficiently supplied to the oxide 530 through the oxide 530c. Note that the concentration of impurities such as water or hydrogen in the insulator 580 is preferably reduced.

The opening in the insulator 580 is formed to overlap with the region between the conductor 542a and the conductor 542b. Accordingly, the conductor 560 is formed to be embedded in the opening in the insulator 580 and the region between the conductor 542a and the conductor 542b.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening in the insulator 580; thus, even when the conductor 560 has a shape with a high aspect ratio, the conductor 560 can be formed without collapsing during the process.

The insulator 574 is preferably provided in contact with the top surface of the insulator 580, the top surface of the conductor 560, and the top surface of the insulator 550. When the insulator 574 is deposited by a sputtering method, an excess-oxygen region can be provided in the insulator 550 and the insulator 580. Thus, oxygen can be supplied from the excess-oxygen region to the oxide 530.

As the insulator 574, a metal oxide containing one or more kinds selected from hafnium, aluminum, gallium, yttrium, zirconium, tungsten, titanium, tantalum, nickel, germanium, magnesium, and the like can be used, for example.

In particular, aluminum oxide has a high barrier property, and even a thin aluminum oxide film having a thickness greater than or equal to 0.5 nm and less than or equal to 3.0 nm can inhibit diffusion of hydrogen and nitrogen. Thus, aluminum oxide deposited by a sputtering method serves as an oxygen supply source and can also have a function of a barrier film against impurities such as hydrogen.

An insulator 581 functioning as an interlayer film is preferably provided over the insulator 574. As in the insulator 524 and the like, the concentration of impurities such as water or hydrogen in the insulator 581 is preferably reduced.

A conductor 540*a* and a conductor 540*b* are positioned in openings formed in the insulator 581, the insulator 574, the insulator 580, and the insulator 544. The conductor 540*a* and the conductor 540*b* are provided to face each other with the conductor 560 therebetween. The structures of the conductor 540*a* and the conductor 540*b* are similar to the structures of a conductor 546 and a conductor 548 that will be described later.

An insulator 582 is provided over the insulator 581. A substance having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has a high blocking effect that inhibits the passage of both oxygen and impurities such as hydrogen and moisture which are factors of a change in electrical characteristics of the transistor. Thus, aluminum oxide can prevent the entry of impurities such as hydrogen and moisture into the transistor 500 in the fabrication process and after the fabrication of the transistor. In addition, release of oxygen from the oxide included in the transistor 500 can be inhibited. Therefore, aluminum oxide is suitably used for a protective film of the transistor 500.

An insulator 586 is provided over the insulator 582. For the insulator 586, a material similar to that for the insulator 320 can be used. When a material with a relatively low permittivity is used for the interlayer film, the parasitic capacitance between wirings can be reduced. A silicon oxide film, a silicon oxynitride film, or the like can be used for the insulator 586, for example.

The conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitive element 600, the transistor 500, or the transistor 300. The conductor 546 and the conductor 548 can be provided using a material similar to the materials for the conductor 328 and the conductor 330.

Next, the capacitive element 600 is provided above the transistor 500. The capacitive element 600 includes a conductor 610, a conductor 620, and an insulator 630.

A conductor 612 may be provided over the conductor 546 and the conductor 548. The conductor 612 has a function of a plug or a wiring that is connected to the transistor 500. The conductor 610 has a function of an electrode of the capacitive element 600. The conductor 612 and the conductor 610 can be formed at the same time.

The conductor 612 and the conductor 610 can be formed using a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 having a single-layer structure are illustrated in FIG. 5, the structure is not limited thereto, and a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 therebetween. Note that the conductor 620 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. In addition, in the case where the conductor 620 is formed concurrently with another component such as a conductor, Cu (copper), Al (aluminum), or the like, which is a low-resistance metal material, is used.

An insulator 650 is provided over the conductor 620 and the insulator 630. The insulator 650 can be provided using a material similar to that for the insulator 320. The insulator 650 may function as a planarization film that covers an uneven shape thereunder.

With the use of this structure, a change in electrical characteristics can be inhibited and reliability can be improved in a semiconductor device including an OS transistor. Alternatively, an OS transistor having a high on-state current can be provided. Alternatively, an OS transistor having a low off-state current can be provided. Alternatively, a semiconductor device with low power consumption can be provided. Alternatively, a semiconductor device including an OS transistor can be miniaturized or highly integrated.

<Structure Example of Transistor>

Note that the structure of the transistor 500 in the semiconductor device described in this embodiment is not limited to the above. Examples of structures that can be used for the transistor 500 will be described below.

<Structure Example 1 of Transistor>

Figure 7A:
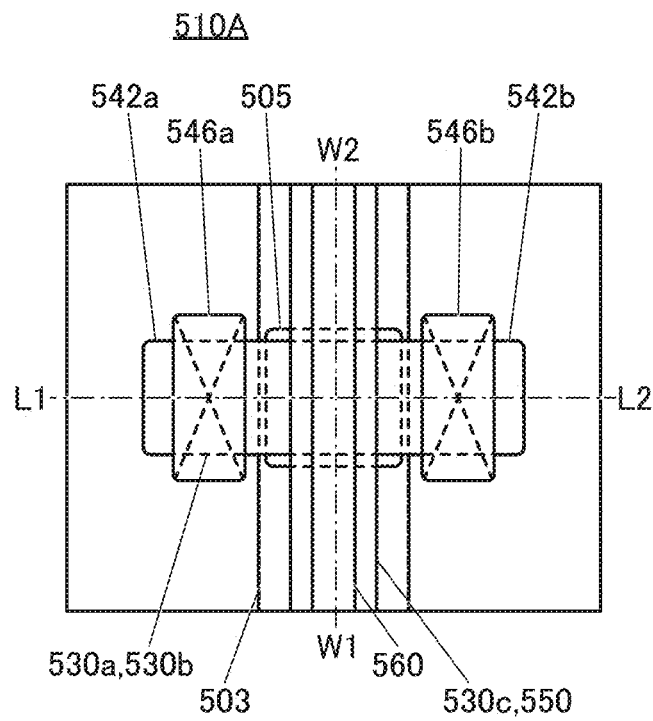
FIG. 7A is a top view showing a structure example of a transistor.
Figure 7C:
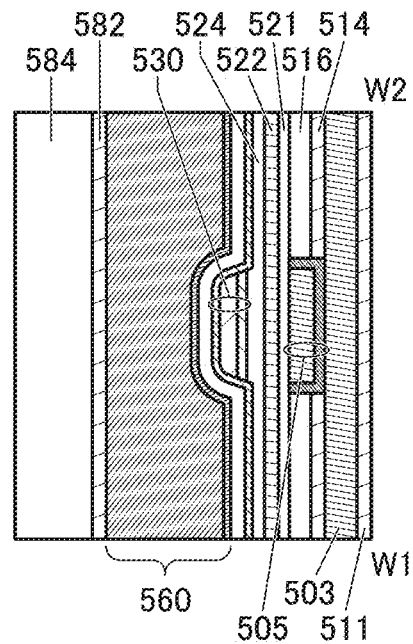
FIG. 7B and FIG. 7C are cross-sectional views showing a structure example of the transistor.
Figure 7B:
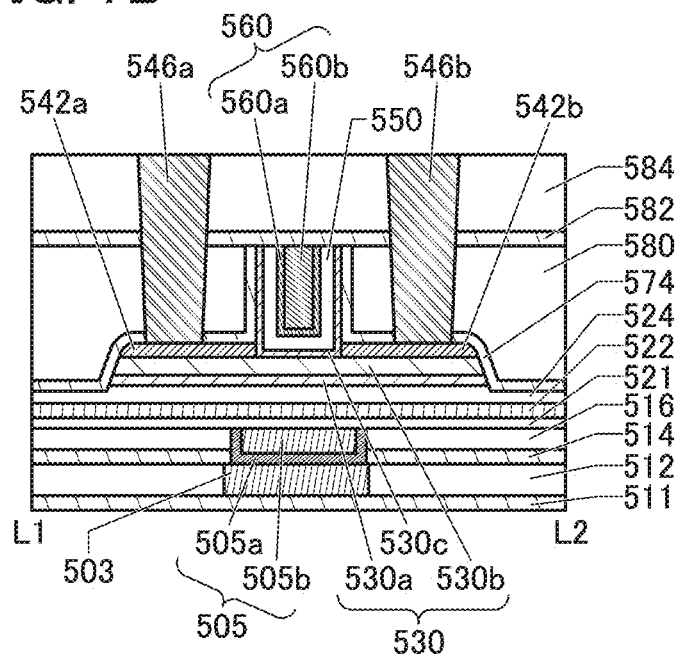

A structure example of a transistor 510A is described with reference to FIG. 7A, FIG. 7B, and FIG. 7C. FIG. 7A is a top view of the transistor 510A. FIG. 7B is a cross-sectional view of a portion indicated by the dashed-dotted line L1-L2 in FIG. 7A. FIG. 7C is a cross-sectional view of a portion indicated by the dashed-dotted line W1-W2 in FIG. 7A. Note that for clarity of the drawing, some components are not illustrated in the top view of FIG. 7A.

FIG. 7A, FIG. 7B, and FIG. 7C show the transistor 510A and the insulator 511, the insulator 512, the insulator 514, the insulator 516, the insulator 580, the insulator 582, and an insulator 584 that function as interlayer films. In addition, the conductor 546 (a conductor 546a and a conductor 546b) that is electrically connected to the transistor 510A and functions as a contact plug, and the conductor 503 functioning as a wiring are illustrated.

The transistor 510A includes the conductor 560 (the conductor 560a and the conductor 560b) functioning as a first gate electrode; a conductor 505 (a conductor 505a and a conductor 505b) functioning as a second gate electrode; the insulator 550 functioning as a first gate insulating film; an insulator 521, the insulator 522, and the insulator 524 that function as a second gate insulating film; the oxide 530 (the oxide 530a, the oxide 530b, and the oxide 530c) including a region where a channel is formed; the conductor 542a functioning as one of a source and a drain; the conductor 542b functioning as the other of the source and the drain; and the insulator 574.

In the transistor 510A shown in FIG. 7B, the oxide 530c, the insulator 550, and the conductor 560 are positioned in an opening portion provided in the insulator 580 with the insulator 574 therebetween. Moreover, the oxide 530c, the insulator 550, and the conductor 560 are positioned between the conductor 542a and the conductor 542b.

The insulator 511 and the insulator 512 each function as an interlayer film.

As the interlayer film, a single layer or stacked layers of an insulator such as silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, tantalum oxide, zirconium oxide, lead zirconate titanate (PZT), strontium titanate ($SrTiO_3$), or (Ba, Sr)$TiO_3$ (BST) can be used. Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

For example, the insulator 511 preferably functions as a barrier film that inhibits entry of impurities such as water or hydrogen into the transistor 510A from the substrate side. Accordingly, for the insulator 511, it is preferable to use an insulating material that has a function of inhibiting diffusion of impurities such as a hydrogen atom, a hydrogen molecule, a water molecule, and a copper atom (through which the above impurities are less likely to pass). Alternatively, it is preferable to use an insulating material that has a function of inhibiting diffusion of oxygen (e.g., at least one of an oxygen atom, an oxygen molecule, and the like) (through which the above oxygen is less likely to pass). Moreover, aluminum oxide or silicon nitride, for example, may be used for the insulator 511. This structure can inhibit diffusion of impurities such as hydrogen and water to the transistor 510A side from the substrate side through the insulator 511.

For example, the permittivity of the insulator 512 is preferably lower than that of the insulator 511. When a material with a low permittivity is used for the interlayer film, the parasitic capacitance generated between wirings can be reduced.

The conductor 503 is formed to be embedded in the insulator 512. Here, the top surface of the conductor 503 and the top surface of the insulator 512 can be substantially level with each other. Note that although the conductor 503 has a single-layer structure, the present invention is not limited thereto. For example, the conductor 503 may have a multi-layer structure of two or more layers. Note that for the conductor 503, a conductive material that has high conductivity and contains tungsten, copper, or aluminum as its main component is preferably used.

In the transistor 510A, the conductor 560 sometimes functions as a first gate electrode. The conductor 505 sometimes functions as a second gate electrode. In that case, the threshold voltage of the transistor 510A can be controlled by changing a potential applied to the conductor 505 independently of a potential applied to the conductor 560. In particular, when a negative potential is applied to the conductor 505, the threshold voltage of the transistor 510A can be higher than 0 V, and the off-state current can be reduced. Thus, a drain current at the time when a potential applied to the conductor 560 is 0 V can be lower in the case where a negative potential is applied to the conductor 505 than in the case where a negative potential is not applied to the conductor 505.

For example, when the conductor 505 and the conductor 560 are provided to overlap with each other, in the case where a potential is applied to the conductor 560 and the conductor 505, an electric field generated from the conductor 560 and an electric field generated from the conductor 505 are connected, so that the channel-formation region formed in the oxide 530 can be covered.

That is, the channel-formation region can be electrically surrounded by the electric field of the conductor 560 having a function of the first gate electrode and the electric field of the conductor 505 having a function of the second gate electrode. In other words, the transistor 510A has a surrounded channel (S-channel) structure, like the transistor 500 described above.

Like the insulator 511 or the insulator 512, the insulator 514 and the insulator 516 each function as an interlayer film. For example, the insulator 514 preferably functions as a barrier film that inhibits entry of impurities such as water or hydrogen into the transistor 510A from the substrate side. This structure can inhibit diffusion of impurities such as hydrogen and water to the transistor 510A side from the substrate side through the insulator 514. Moreover, for example, the insulator 516 preferably has a lower permittivity than the insulator 514. When a material with a low permittivity is used for the interlayer film, the parasitic capacitance generated between wirings can be reduced.

In the conductor 505 functioning as the second gate, the conductor 505a is formed in contact with an inner wall of an opening in the insulator 514 and the insulator 516, and the conductor 505b is formed further inside. Here, the top surfaces of the conductor 505a and the conductor 505b and the top surface of the insulator 516 can be substantially level with each other. Although the transistor 510A has a structure in which the conductor 505a and the conductor 505b are stacked, the present invention is not limited thereto. For example, the conductor 505 may have a single-layer structure or a stacked-layer structure of three or more layers.

Here, for the conductor 505a, it is preferable to use a conductive material that has a function of inhibiting diffusion of impurities such as a hydrogen atom, a hydrogen molecule, a water molecule, and a copper atom (through which the above impurities are less likely to pass). Alternatively, it is preferable to use a conductive material that has a function of inhibiting diffusion of oxygen (e.g., at least one of an oxygen atom, an oxygen molecule, and the like) (through which the above oxygen is less likely to pass). Note that in this specification and the like, a function of inhibiting diffusion of impurities or oxygen means a function of inhibiting diffusion of any one or all of the above impurities and the above oxygen.

For example, when the conductor 505a has a function of inhibiting diffusion of oxygen, a reduction in conductivity of the conductor 505b due to oxidation can be inhibited.

In the case where the conductor 505 doubles as a wiring, the conductor 505b is preferably formed using a conductive material that has high conductivity and contains tungsten, copper, or aluminum as its main component. In that case, the conductor 503 is not necessarily provided. Note that the conductor 505b is illustrated as a single layer but may have a stacked-layer structure, for example, a stack of any of the above conductive materials and titanium or titanium nitride.

The insulator 521, the insulator 522, and the insulator 524 each have a function of a second gate insulating film.

The insulator 522 preferably has a barrier property. The insulator 522 having a barrier property functions as a layer that inhibits entry of impurities such as hydrogen into the transistor 510A from the surroundings of the transistor 510A.

For the insulator 522, a single layer or stacked layers of an insulator containing aluminum oxide, hafnium oxide, an oxide containing aluminum and hafnium (hafnium aluminate), oxynitride containing aluminum and hafnium, tantalum oxide, zirconium oxide, lead zirconate titanate (PZT), strontium titanate ($SrTiO_3$), or $(Ba,Sr)TiO_3$ (BST), are preferably used, for example. With miniaturization and high integration of transistors, a problem such as leakage current may arise because of a thinner gate insulating film. When a high-k material is used for the insulator functioning as the gate insulating film, a gate potential at the time when the transistor operates can be reduced while the physical thickness is maintained.

It is preferable that the insulator 521 be thermally stable. For example, silicon oxide and silicon oxynitride, which have thermal stability, are preferable. In addition, a combination of an insulator of a high-k material and silicon oxide or silicon oxynitride allows the insulator 521 to have a stacked-layer structure with thermal stability and a high dielectric constant.

Note that the second gate insulating film is shown to have a stacked-layer structure of three layers in FIG. 7B and FIG. 7C, but may have a stacked-layer structure of two or less layers or four or more layers. In such cases, without limitation to a stacked-layer structure formed of the same material, a stacked-layer structure formed of different materials may be employed.

The oxide 530 including a region functioning as the channel-formation region includes the oxide 530a, the oxide 530b over the oxide 530a, and the oxide 530c over the oxide 530b. Including the oxide 530a under the oxide 530b makes it possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c. As the oxide 530, the above-described oxide semiconductor, which is one type of metal oxide, can be used.

Note that the oxide 530c is preferably provided in the opening portion provided in the insulator 580 with the insulator 574 therebetween. When the insulator 574 has a barrier property, diffusion of impurities from the insulator 580 into the oxide 530 can be inhibited.

One of the conductors 542 functions as a source electrode and the other functions as a drain electrode.

For the conductor 542a and the conductor 542b, a metal such as aluminum, titanium, chromium, nickel, copper, yttrium, zirconium, molybdenum, silver, tantalum, or tungsten or an alloy containing any of the metals as its main component can be used. In particular, a metal nitride film of tantalum nitride or the like is preferable because it has a barrier property against hydrogen or oxygen and high oxidation resistance.

Although a single-layer structure is illustrated in FIG. 7B, a stacked-layer structure of two or more layers may also be employed. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed thereover; and a three-layer structure where a molybdenum film or a molybdenum nitride film is formed, an aluminum film or a copper film is stacked over the molybdenum film or the molybdenum nitride film, and a molybdenum film or a molybdenum nitride film is formed thereover. Note that a transparent conductive material containing indium oxide, tin oxide, or zinc oxide may be used.

A barrier layer may be provided over the conductor 542. The barrier layer is preferably formed using a substance having a barrier property against oxygen or hydrogen. This structure can inhibit oxidation of the conductor 542 at the time of depositing the insulator 574.

A metal oxide can be used for the barrier layer, for example. In particular, an insulating film of aluminum oxide, hafnium oxide, gallium oxide, or the like, which has a barrier property against oxygen and hydrogen, is preferably used. Alternatively, silicon nitride formed by a CVD method may be used.

With the barrier layer, the range of choices for the material of the conductor 542 can be expanded. For example, a material having a low oxidation resistance and high conductivity, such as tungsten or aluminum, can be used for the conductor 542. Moreover, for example, a conductor that can be easily deposited or processed can be used.

The insulator 550 functions as a first gate insulating film. The insulator 550 is preferably provided in the opening portion provided in the insulator 580 with the oxide 530c and the insulator 574 therebetween.

With miniaturization and high integration of transistors, a problem such as leakage current may arise because of a thinner gate insulating film. In that case, the insulator 550 may have a stacked-layer structure like the second gate insulating film. When the insulator functioning as the gate insulating film has a stacked-layer structure of a high-k material and a thermally stable material, a gate potential at the time when the transistor operates can be reduced while the physical thickness is maintained. Furthermore, the stacked-layer structure can be thermally stable and have a high dielectric constant.

The conductor 560 functioning as the first gate electrode includes the conductor 560a and the conductor 560b over the conductor 560a. Like the conductor 505a, the conductor 560a is preferably formed using a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of an oxygen atom, an oxygen molecule, and the like).

When the conductor 560a has a function of inhibiting oxygen diffusion, the range of choices for the material of the conductor 560b can be expanded. That is, the conductor 560a inhibits oxidation of the conductor 560b, thereby preventing a decrease in conductivity.

As a conductive material having a function of inhibiting diffusion of oxygen, tantalum, tantalum nitride, ruthenium, or ruthenium oxide is preferably used, for example. For the conductor 560a, the oxide semiconductor that can be used as the oxide 530 can be used. In that case, when the conductor 560b is deposited by a sputtering method, the conductor 560a can have a reduced electric resistance value to be a conductor. This can be referred to as an OC (Oxide Conductor) electrode.

The conductor 560b is preferably formed using a conductive material containing tungsten, copper, or aluminum as its main component. In addition, since the conductor 560 functions as a wiring, a conductor having high conductivity is preferably used as the conductor 560b. For example, a conductive material containing tungsten, copper, or aluminum as its main component can be used. The conductor 560b may have a stacked-layer structure, for example, a stack of any of the above conductive materials and titanium or titanium nitride.

The insulator 574 is positioned between the insulator 580 and the transistor 510A. For the insulator 574, an insulating material having a function of inhibiting diffusion of oxygen and impurities such as water or hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulator 574 can inhibit diffusion of impurities such as water and hydrogen contained in the insulator 580 into the oxide 530b through the oxide 530c and the insulator 550. Furthermore, oxidation of the conductor 560 due to excess oxygen contained in the insulator 580 can be inhibited.

The insulator 580, the insulator 582, and the insulator 584 each function as an interlayer film.

Like the insulator 514, the insulator 582 preferably functions as a barrier insulating film that inhibits entry of impurities such as water or hydrogen into the transistor 510A from the outside.

Like the insulator 516, the insulator 580 and the insulator 584 preferably have a lower permittivity than the insulator 582. When a material with a low permittivity is used for the interlayer film, the parasitic capacitance generated between wirings can be reduced.

The transistor 510A may be electrically connected to another component through a plug or a wiring such as the conductor 546 embedded in the insulator 580, the insulator 582, and the insulator 584.

As a material for the conductor 546, a single layer or stacked layers of a conductive material such as a metal material, an alloy material, a metal nitride material, or a metal oxide material can be used, as in the case of the conductor 505. For example, it is preferable to use a high-melting-point material that has both heat resistance and conductivity, such as tungsten or molybdenum. Alternatively, it is preferable to use a low-resistance conductive material such as aluminum or copper. The use of a low-resistance conductive material can reduce wiring resistance.

For example, when the conductor 546 has a stacked-layer structure of tantalum nitride or the like, which is a conductor having a barrier property against hydrogen and oxygen, and tungsten, which has high conductivity, diffusion of impurities from the outside can be inhibited while the conductivity of the wiring is maintained.

With the above structure, an OS transistor having a high on-state current can be provided. Alternatively, an OS transistor having a low off-state current can be provided. Alternatively, in a semiconductor device including an OS transistor, variations in electrical characteristics can be inhibited and the reliability can be improved.

<Structure Example 2 of Transistor >

Figure 8A:
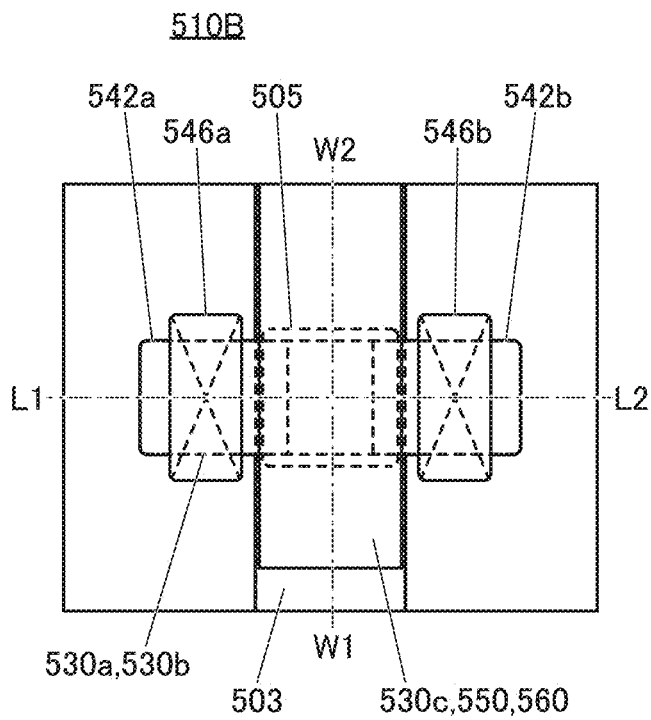
FIG. 8A is a top view showing a structure example of a transistor.
Figure 8C:
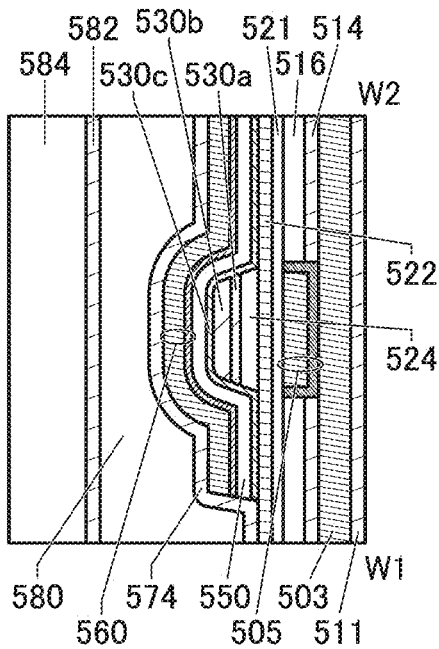
FIG. 8B and FIG. 8C are cross-sectional views showing a structure example of the transistor.
Figure 8B:
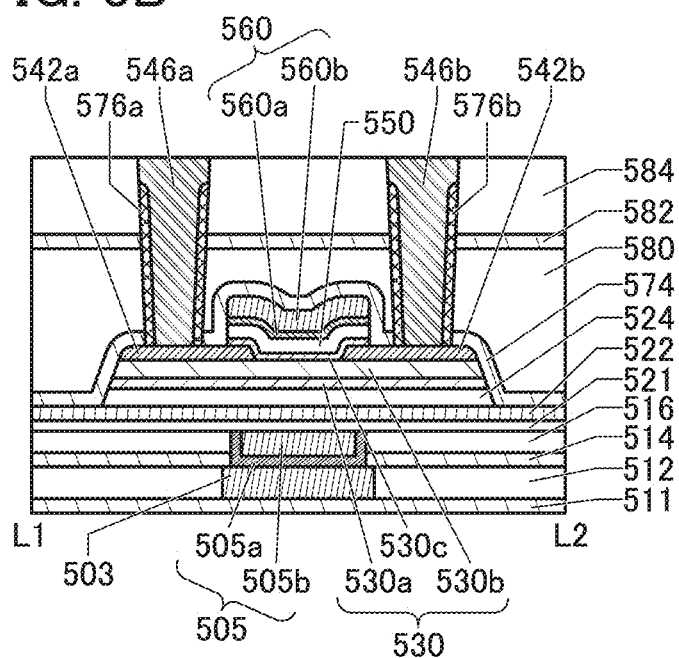

A structure example of a transistor 510B is described with reference to FIG. 8A, FIG. 8B, and FIG. 8C. FIG. 8A is a top view of the transistor 510B. FIG. 8B is a cross-sectional view of a portion indicated by a dashed-dotted line L1-L2 in FIG. 8A. FIG. 8C is a cross-sectional view of a portion indicated by a dashed-dotted line W1-W2 in FIG. 8A. Note that for clarity of the drawing, some components are not illustrated in the top view of FIG. 8A.

The transistor 510B is a modification example of the transistor 510A. Therefore, differences from the transistor 510A will be mainly described to avoid repeated description.

The transistor 510B includes a region where the oxide 530c, the insulator 550, and the conductor 560 overlap with the conductor 542 (the conductor 542a and the conductor 542b). With this structure, a transistor having a high on-state current can be provided. Moreover, a transistor having high controllability can be provided.

The conductor 560 functioning as the first gate electrode includes the conductor 560a and the conductor 560b over the conductor 560a. Like the conductor 505a, the conductor 560a is preferably formed using a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of an oxygen atom, an oxygen molecule, and the like).

When the conductor 560a has a function of inhibiting oxygen diffusion, the range of choices for the material of the conductor 560b can be expanded. That is, the conductor 560a inhibits oxidation of the conductor 560b, thereby preventing a decrease in conductivity.

The insulator 574 is preferably provided to cover the top surface and a side surface of the conductor 560, a side surface of the insulator 550, and a side surface of the oxide 530c. For the insulator 574, an insulating material having a function of inhibiting diffusion of oxygen and impurities such as water or hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulator 574 can inhibit oxidation of the conductor 560. Moreover, the insulator 574 can inhibit diffusion of impurities such as water and hydrogen contained in the insulator 580 into the transistor 510B.

An insulator 576 (an insulator 576a and an insulator 576b) having a barrier property may be provided between the conductor 546 and the insulator 580. Providing the insulator 576 can inhibit oxygen in the insulator 580 from reacting with the conductor 546 and oxidizing the conductor 546.

Furthermore, with the insulator 576 having a barrier property, the range of choices for the material of the conductor used as the plug or the wiring can be expanded. The use of a metal material having an oxygen absorbing property and high conductivity for the conductor 546, for example, can provide a semiconductor device with low power consumption. Specifically, a material having a low oxidation resistance and high conductivity, such as tungsten or aluminum, can be used. Moreover, for example, a conductor that can be easily deposited or processed can be used.

<Structure Example 3 of Transistor>

Figure 9A:
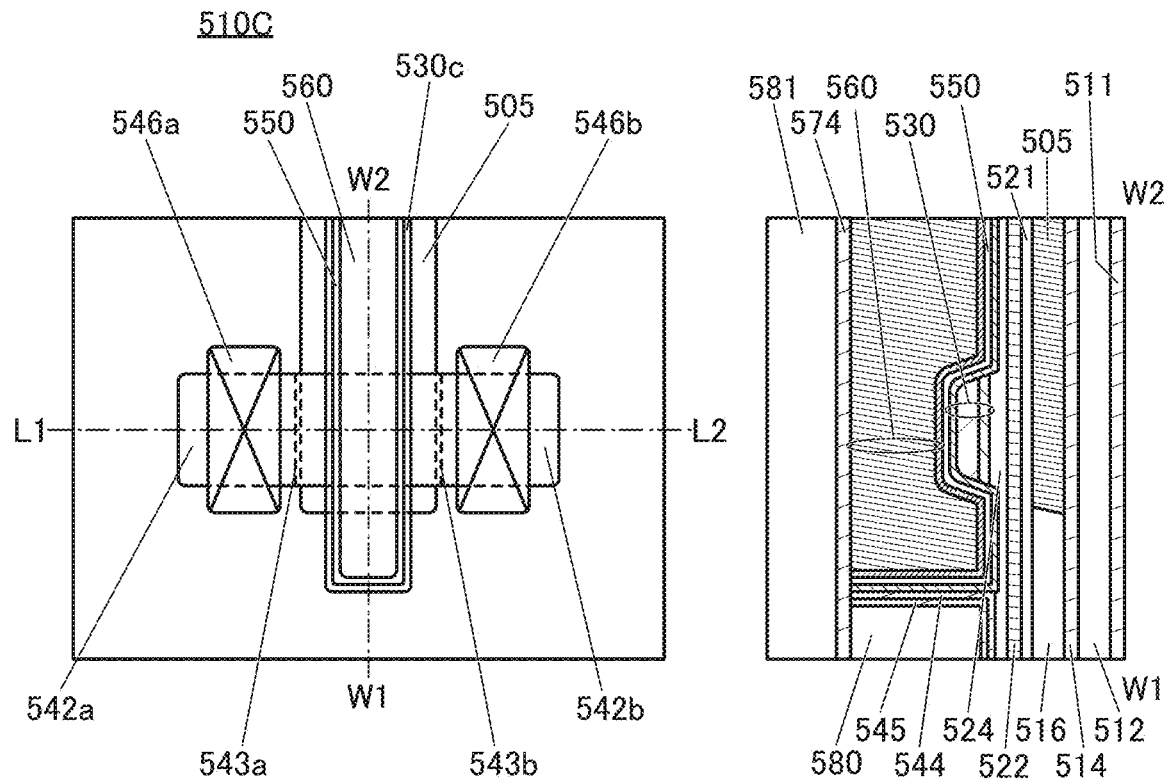
FIG. 9A is a top view showing a structure example of a transistor.
Figure 9C:
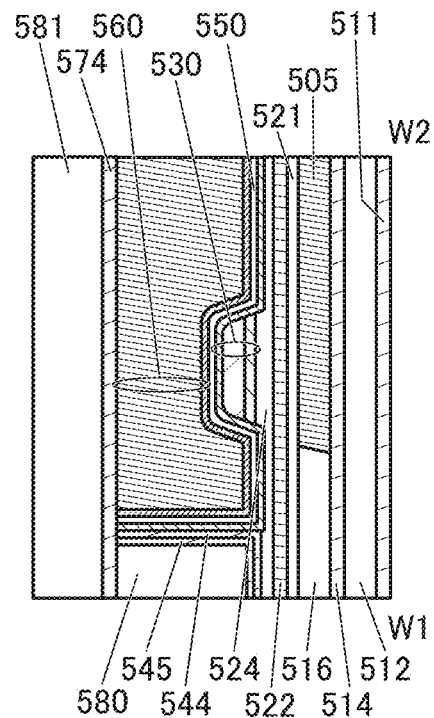
FIG. 9B and FIG. 9C are cross-sectional views showing a structure example of the transistor.
Figure 9B:
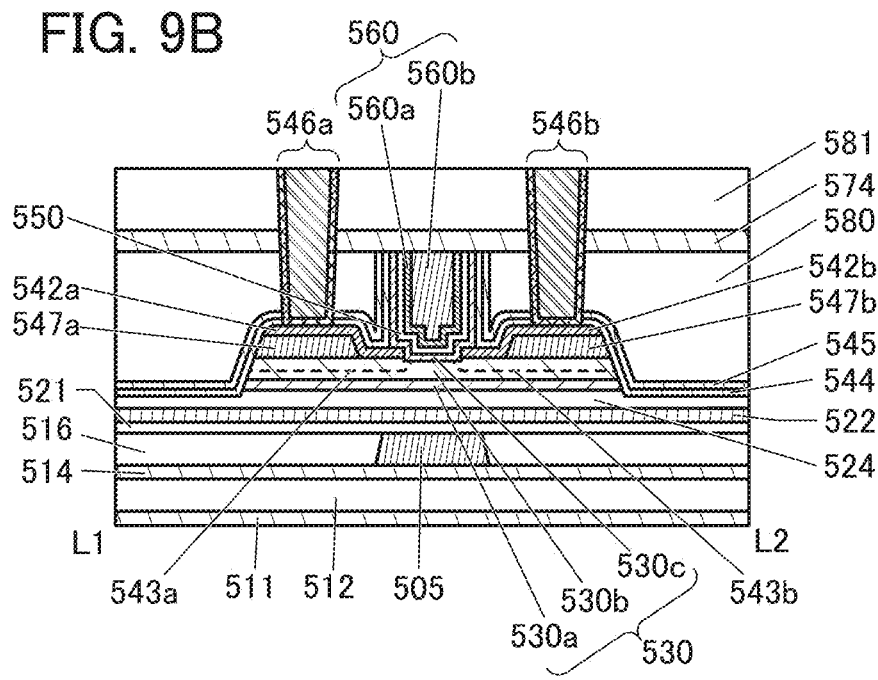

A structure example of a transistor 510C is described with reference to FIG. 9A, FIG. 9B, and FIG. 9C. FIG. 9A is a top view of the transistor 510C. FIG. 9B is a cross-sectional view of a portion indicated by a dashed-dotted line L1-L2 in FIG. 9A. FIG. 9C is a cross-sectional view of a portion indicated by a dashed-dotted line W1-W2 in FIG. 9A. Note that for clarity of the drawing, some components are not illustrated in the top view of FIG. 9A.

The transistor 510C is a modification example of the transistor 510A. Therefore, differences from the transistor 510A will be mainly described to avoid repeated description.

In the transistor 510C shown in FIG. 9A, FIG. 9B, and FIG. 9C, a conductor 547a is positioned between the conductor 542a and the oxide 530b, and a conductor 547b is positioned between the conductor 542b and the oxide 530b. Here, the conductor 542a (the conductor 542b) has a region that extends beyond the top surface of the conductor 547a (the conductor 547b) and its side surface on the conductor 560 side and is in contact with the top surface of the oxide 530b. For the conductors 547, a conductor that can be used as the conductor 542 is used. It is preferable that the thickness of the conductor 547 be at least greater than that of the conductor 542.

In the transistor 510C shown in FIG. 9A, FIG. 9B, and FIG. 9C, because of the above structure, the conductor 542 can be closer to the conductor 560 than in the transistor 510A. Alternatively, the conductor 560 can overlap with an end portion of the conductor 542a and an end portion of the conductor 542b. Thus, the effective channel length of the transistor 510C can be shortened, and the on-state current and the frequency characteristics can be improved.

The conductor 547a (the conductor 547b) is preferably provided to overlap with the conductor 542a (the conductor 542b). With such a structure, the conductor 547a (the conductor 547b) can function as a stopper to prevent overetching of the oxide 530b in etching for forming the opening in which the conductor 546a (the conductor 546b) is to be embedded.

The transistor 510C shown in FIG. 9A, FIG. 9B, and FIG. 9C may have a structure in which an insulator 545 is positioned over and in contact with the insulator 544. The insulator 544 preferably functions as a barrier insulating film that inhibits entry of impurities such as water or hydrogen and excess oxygen into the transistor 510C from the insulator 580 side. The insulator 545 can be formed using an insulator that can be used for the insulator 544. In addition, the insulator 544 may be formed using a nitride insulator such as aluminum nitride, aluminum titanium nitride, titanium nitride, silicon nitride, or silicon nitride oxide, for example.

Unlike in the transistor 510A shown in FIG. 7A, FIG. 7B, and FIG. 7C, in the transistor 510C shown in FIG. 9A, FIG. 9B, and FIG. 9C, the conductor 505 may have a single-layer structure. In this case, an insulating film to be the insulator 516 is formed over the patterned conductor 505, and an upper portion of the insulating film is removed by a CMP method or the like until the top surface of the conductor 505 is exposed. Preferably, the planarity of the top surface of the conductor 505 is made favorable. For example, the average surface roughness (Ra) of the top surface of the conductor 505 is less than or equal to 1 nm, preferably less than or equal to 0.5 nm, and further preferably less than or equal to 0.3 nm. This allows the improvement in planarity of an insulating layer formed over the conductor 505 and the increase in crystallinity of the oxide 530b and the oxide 530c.

<Structure Example 4 of Transistor>

A structure example of a transistor 510D is described with reference to FIG. 10A, FIG. 10B, and FIG. 10C. FIG. 10A is a top view of the transistor 510D. FIG. 10B is a cross-sectional view of a portion indicated by a dashed-dotted line L1-L2 in FIG. 10A. FIG. 10C is a cross-sectional view of a portion indicated by a dashed-dotted line W1-W2 in FIG. 10A. Note that for clarity of the drawing, some components are not illustrated in the top view in FIG. 10A.

The transistor 510D is a modification example of the above transistors. Therefore, differences from the above transistors will be mainly described to avoid repeated description.

In FIG. 10A, FIG. 10B, and FIG. 10C, the conductor 503 is not provided, and the conductor 505 that has a function of a second gate is made to function also as a wiring. In addition, the insulator 550 is provided over the oxide 530c and a metal oxide 552 is provided over the insulator 550. In addition, the conductor 560 is provided over the metal oxide 552, and an insulator 570 is provided over the conductor 560. Furthermore, an insulator 571 is provided over the insulator 570.

The metal oxide 552 preferably has a function of inhibiting diffusion of oxygen. When the metal oxide 552 that inhibits oxygen diffusion is provided between the insulator 550 and the conductor 560, diffusion of oxygen into the conductor 560 is inhibited. That is, a reduction in the amount of oxygen supplied to the oxide 530 can be inhibited. Moreover, oxidation of the conductor 560 due to oxygen can be inhibited.

Note that the metal oxide 552 may have a function of part of the first gate. For example, the oxide semiconductor that can be used for the oxide 530 can be used for the metal oxide 552. In this case, when the conductor 560 is deposited by a sputtering method, the electrical resistance value of the metal oxide 552 is lowered so that the metal oxide 552 can be a conductive layer. This can be referred to as an OC (Oxide Conductor) electrode.

The metal oxide 552 may have a function of part of a gate insulating film. Thus, when silicon oxide, silicon oxynitride, or the like is used for the insulator 550, a metal oxide that is a high-k material with a high dielectric constant is preferably used for the metal oxide 552. Such a stacked-layer structure can be thermally stable and can have a high dielectric constant. Thus, a gate potential that is applied when the transistor operates can be lowered while the physical thickness is maintained. In addition, the equivalent oxide thickness (EOT) of an insulating layer functioning as the gate insulating film can be reduced.

Although the metal oxide 552 in the transistor 510D is shown as a single layer, the metal oxide 552 may have a stacked-layer structure of two or more layers. For example, a metal oxide functioning as part of the gate electrode and a metal oxide functioning as part of the gate insulating film may be stacked.

With the metal oxide 552 functioning as a gate electrode, the on-state current of the transistor 510D can be increased without a reduction in the influence of the electric field from the conductor 560. With the metal oxide 552 functioning as the gate insulating film, the distance between the conductor 560 and the oxide 530 is kept by the physical thicknesses of the insulator 550 and the metal oxide 552, so that leakage current between the conductor 560 and the oxide 530 can be reduced. Thus, with the stacked-layer structure of the insulator 550 and the metal oxide 552, the physical distance between the conductor 560 and the oxide 530 and the intensity of electric field applied from the conductor 560 to the oxide 530 can be easily adjusted as appropriate.

Specifically, the oxide semiconductor that can be used for the oxide 530 can also be used for the metal oxide 552 when the resistance thereof is reduced. Alternatively, a metal oxide containing one kind or two or more kinds selected from hafnium, aluminum, gallium, yttrium, zirconium, tungsten, titanium, tantalum, nickel, germanium, magnesium, and the like can be used.

It is particularly preferable to use an insulating layer containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable because it is less likely to be crystallized by heat treatment in a later step. Note that the metal oxide 552 is not an essential component. Design is appropriately set in consideration of required transistor characteristics.

For the insulator 570, an insulating material having a function of inhibiting the passage of oxygen and impurities such as water and hydrogen is preferably used. For example, aluminum oxide or hafnium oxide is preferably used. Thus, oxidation of the conductor 560 due to oxygen from above the insulator 570 can be inhibited. Moreover, entry of impurities such as water or hydrogen from above the insulator 570 into the oxide 530 through the conductor 560 and the insulator 550 can be inhibited.

The insulator 571 functions as a hard mask. By providing the insulator 571, the conductor 560 can be processed to have a side surface that is substantially vertical; specifically, an angle formed by the side surface of the conductor 560 and a substrate surface can be greater than or equal to 75° and less than or equal to 100°, preferably greater than or equal to 80° and less than or equal to 95°.

Note that an insulating material having a function of inhibiting the passage of oxygen and impurities such as water or hydrogen may be used for the insulator 571 so that the insulator 571 also functions as a barrier layer. In that case, the insulator 570 does not have to be provided.

Parts of the insulator 570, the conductor 560, the metal oxide 552, the insulator 550, and the oxide 530c are selected and removed using the insulator 571 as a hard mask, whereby their side surfaces can be substantially aligned with each other and a surface of the oxide 530b can be partly exposed.

The transistor 510D includes a region 531a and a region 531b on a part of the exposed surface of the oxide 530b. One of the region 531a and the region 531b functions as a source region, and the other functions as a drain region.

The region 531a and the region 531b can be formed by addition of an impurity element such as phosphorus or boron to the exposed surface of the oxide 530b by an ion implantation method, an ion doping method, a plasma immersion ion implantation method, or plasma treatment, for example. In this embodiment and the like, an "impurity element" refers to an element other than main constituent elements.

Alternatively, the region 531a and the region 531b can be formed in such a manner that, after a part of the surface of the oxide 530b is exposed, a metal film is formed and then heat treatment is performed so that the element contained in the metal film is diffused into the oxide 530b.

The electrical resistivity of regions of the oxide 530b to which the impurity element has been added decreases. For that reason, the region 531a and the region 531b are sometimes referred to as "impurity regions" or "low-resistance regions".

The region 531a and the region 531b can be formed in a self-aligned manner by using the insulator 571 and/or the conductor 560 as a mask. Thus, the conductor 560 does not overlap with the region 531a and/or the region 531b, so that the parasitic capacitance can be reduced. Moreover, an offset region is not formed between a channel-formation region and the source/drain region (the region 531a or the region 531b). The formation of the region 531a and the region 531b in a self-aligned manner achieves an increase in on-state current, a reduction in threshold voltage, and an improvement in operating frequency, for example.

Note that an offset region may be provided between the channel-formation region and the source/drain region in order to further reduce the off-state current. The offset region is a region where the electrical resistivity is high and the impurity element is not added. The offset region can be formed by the addition of the impurity element after the formation of an insulator 575. In this case, the insulator 575 serves as a mask like the insulator 571 or the like. Thus, the impurity element is not added to a region of the oxide 530b overlapping with the insulator 575, so that the electrical resistivity of the region can be kept high.

The transistor 510D includes the insulator 575 on the side surfaces of the insulator 570, the conductor 560, the metal oxide 552, the insulator 550, and the oxide 530c. The insulator 575 is preferably an insulator having a low dielectric constant. For example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like is preferably used. In particular, silicon oxide, silicon oxynitride, silicon nitride oxide, or porous silicon oxide is preferably used for the insulator 575, in which case an excess-oxygen region can be easily formed in the insulator 575 in a later step. Silicon oxide and silicon oxynitride are preferable because of their thermal stability. The insulator 575 preferably has a function of diffusing oxygen.

The transistor 510D also includes the insulator 574 over the insulator 575 and the oxide 530. The insulator 574 is preferably deposited by a sputtering method. When a sputtering method is used, an insulator containing few impurities such as water or hydrogen can be deposited. For example, aluminum oxide is preferably used for the insulator 574.

Note that an oxide film obtained by a sputtering method may extract hydrogen from the component over which the oxide film is deposited. Thus, the hydrogen concentration in the oxide 530 and the insulator 575 can be reduced when the insulator 574 absorbs hydrogen and water from the oxide 530 and the insulator 575.

<Structure Example 5 of Transistor>

Figure 11A:
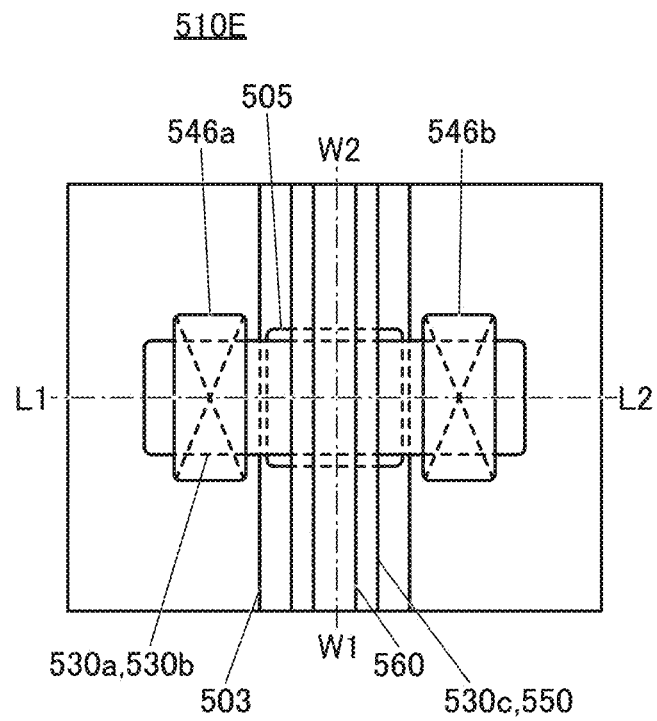
FIG. 11A is a top view showing a structure example of a transistor.
Figure 11C:
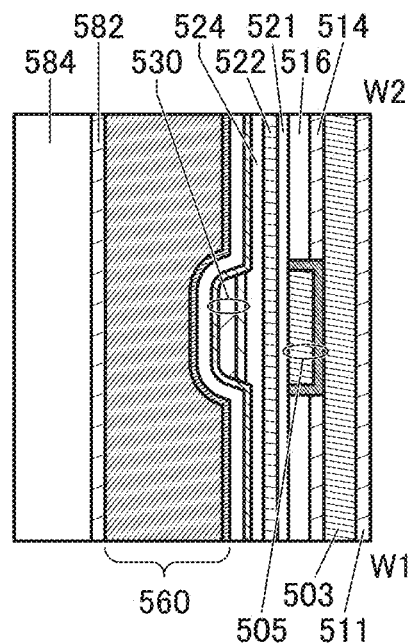
FIG. 11B and FIG. 11C are cross-sectional views showing a structure example of the transistor.
Figure 11B:
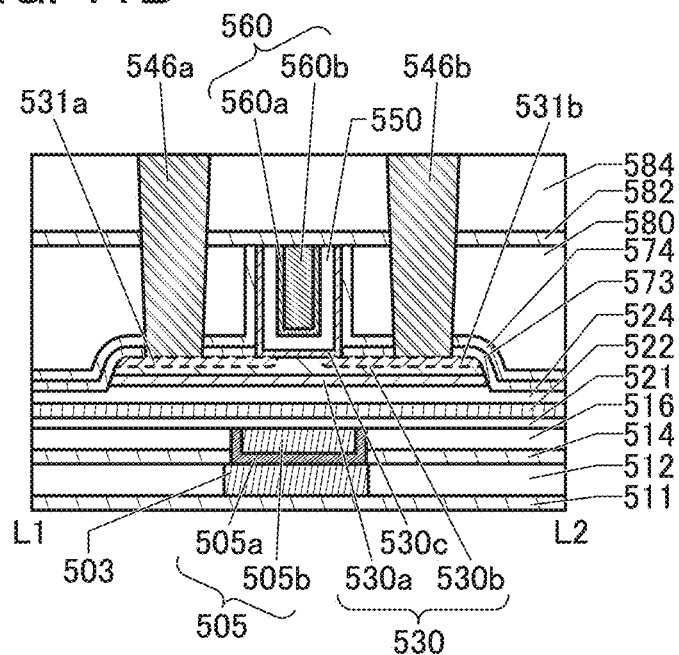

A structure example of a transistor 510E is described with reference to FIG. 11A, FIG. 11B, and FIG. 11C. FIG. 11A is a top view of the transistor 510E. FIG. 11B is a cross-sectional view of a portion indicated by the dashed-dotted line L1-L2 in FIG. 11A. FIG. 11C is a cross-sectional view of a portion indicated by the dashed-dotted line W1-W2 in FIG. 11A. Note that for clarity of the drawing, some components are not illustrated in the top view in FIG. 11A.

The transistor 510E is a modification example of the above transistors. Therefore, differences from the above transistors will be mainly described to avoid repeated description.

In FIG. 11A, FIG. 11B, and FIG. 11C, the conductor 542 is not provided, and a part of the exposed surface of the oxide 530b includes the region 531a and the region 531b. One of the region 531a and the region 531b functions as a source region, and the other functions as a drain region. Moreover, an insulator 573 is included between the oxide 530b and the insulator 574.

The regions 531 (the region 531a and the region 531b) shown in FIG. 11B are regions where an element described below is added to the oxide 530b. The regions 531 can be formed using a dummy gate, for example.

Specifically, a dummy gate is provided over the oxide 530b, and the element that reduces the resistance of the oxide 530b is added using the dummy gate as a mask. That is, the element is added to regions of the oxide 530 that do not overlap with the dummy gate, whereby the regions 531 are formed. As a method of adding the element, an ion implantation method by which an ionized source gas is subjected to mass separation and then added, an ion doping method by which an ionized source gas is added without mass separation, a plasma immersion ion implantation method, or the like can be used.

Typical examples of the element that reduces the resistance of the oxide 530 are boron and phosphorus. Moreover, hydrogen, carbon, nitrogen, fluorine, sulfur, chlorine, titanium, a rare gas, or the like may be used. Typical examples of the rare gas include helium, neon, argon, krypton, and xenon. The concentration of the element is measured by secondary ion mass spectrometry (SIMS) or the like.

In particular, boron and phosphorus are preferable because an apparatus used in a manufacturing line for low-temperature polysilicon can be used, for example. Since the existing facility can be used, capital investment can be reduced.

Next, an insulating film to be the insulator 573 and an insulating film to be the insulator 574 may be formed over the oxide 530b and the dummy gate. Stacking the insulating film to be the insulator 573 and the insulating film to be the insulator 574 can provide a region where the oxide 530c and the insulator 550 overlap with the region 531.

Specifically, after an insulating film to be the insulator 580 is provided over the insulating film to be the insulator 574, the insulating film to be the insulator 580 is subjected to CMP (Chemical Mechanical Polishing) treatment, whereby a part of the insulating film to be the insulator 580 is removed and the dummy gate is exposed. Then, when the dummy gate is removed, a part of the insulator 573 in contact with the dummy gate is preferably also removed. Thus, the insulator 574 and the insulator 573 are exposed at a side surface of an opening portion provided in the insulator 580, and the region 531 provided in the oxide 530b is partly exposed at the bottom surface of the opening portion. Next, an oxide film to be the oxide 530c, an insulating film to be the insulator 550, and a conductive film to be the conductor 560 are formed in this order in the opening portion, and then the oxide film to be the oxide 530c, the insulating film to be the insulator 550, and the conductive film to be the conductor 560 are partly removed by CMP treatment or the like until the insulator 580 is exposed; thus, the transistor shown in FIG. 11A, FIG. 11B, and FIG. 11C can be formed.

Note that the insulator 573 and the insulator 574 are not essential components. Design is appropriately set in consideration of required transistor characteristics.

The cost of the transistor shown in FIG. 11A, FIG. 11B, and FIG. 11C can be reduced because an existing apparatus can be used and the conductor 542 is not provided.

<Structure Example 6 of Transistor>

Figure 12A:
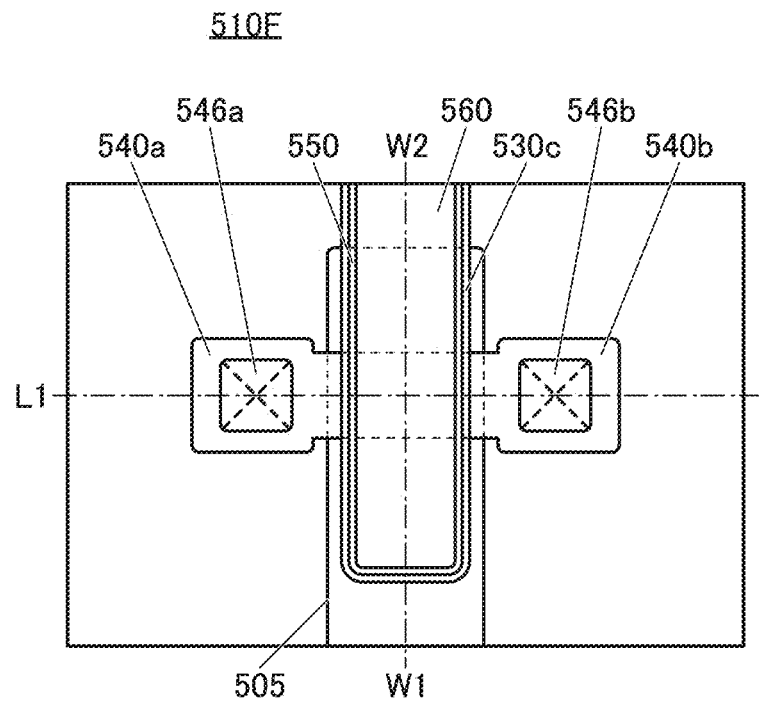
FIG. 12A is a top view showing a structure example of a transistor.
Figure 12C:
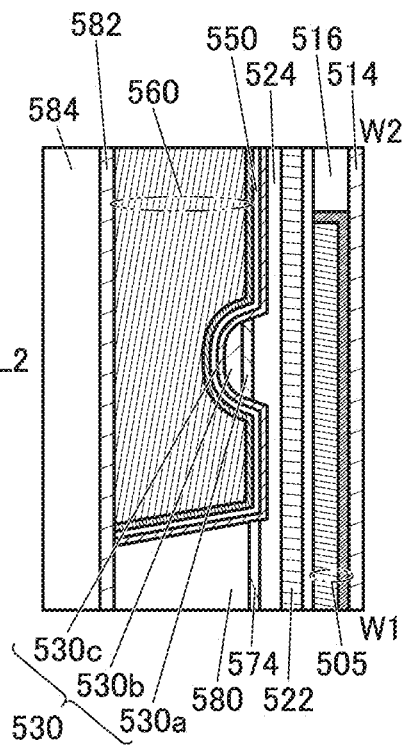
FIG. 12B and FIG. 12C are cross-sectional views showing a structure example of the transistor.
Figure 12B:
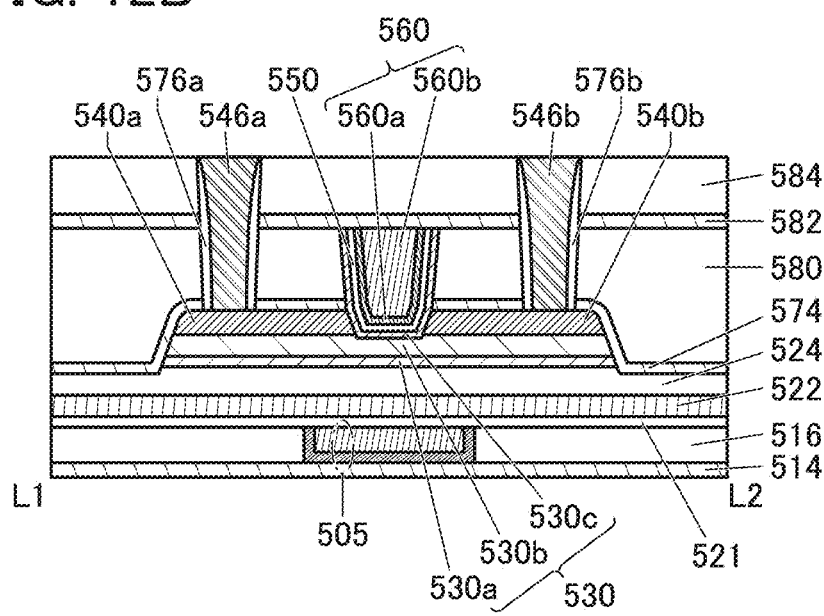

A structure example of a transistor 510F is described with reference to FIG. 12A, FIG. 12B, and FIG. 12C. FIG. 12A is a top view of the transistor 510F. FIG. 12B is a cross-sectional view of a portion indicated by a dashed-dotted line L1-L2 in FIG. 12A. FIG. 12C is a cross-sectional view of a portion indicated by a dashed-dotted line W1-W2 in FIG. 12A. Note that for clarity of the drawing, some components are not illustrated in the top view in FIG. 12A.

The transistor 510F is a modification example of the transistor 510A. Therefore, differences from the above transistors will be mainly described to avoid repeated description.

In the transistor 510A, a part of the insulator 574 is provided in the opening portion provided in the insulator 580 and covers the side surface of the conductor 560. Meanwhile, in the transistor 510F, an opening is formed by partly removing the insulator 580 and the insulator 574.

An insulator 576 (an insulator 576a and an insulator 576b) having a barrier property may be provided between the conductor 546 and the insulator 580. Providing the insulator 576 can inhibit oxygen in the insulator 580 from reacting with the conductor 546 and oxidizing the conductor 546.

Note that when an oxide semiconductor is used as the oxide 530, the oxide 530 preferably has a stacked-layer structure of a plurality of oxide layers that differ in the atomic ratio of metal atoms. Specifically, the atomic proportion of the element M in the constituent elements in the metal oxide used as the oxide 530a is preferably higher than the atomic proportion of the element M in the constituent elements in the metal oxide used as the oxide 530b. In addition, the atomic ratio of the element M to In in the metal oxide used as the oxide 530a is preferably higher than the atomic ratio of the element M to In in the metal oxide used as the oxide 530b. Furthermore, the atomic ratio of In to the elementM in the metal oxide used as the oxide 530b is preferably higher than the atomic ratio of In to the element M in the metal oxide used as the oxide 530a. A metal oxide that can be used as the oxide 530a or the oxide 530b can be used as the oxide 530c.

The oxide 530a, the oxide 530b, and the oxide 530c preferably have crystallinity, and in particular, it is preferable to use a CAAC-OS. An oxide having crystallinity, such as a CAAC-OS, has a dense structure with small amounts of impurities and defects (e.g., oxygen vacancies) and high crystallinity. This can inhibit extraction of oxygen from the oxide 530b by the source electrode or the drain electrode. This can reduce extraction of oxygen from the oxide 530b even when heat treatment is performed; hence, the transistor 510F is stable against high temperatures (i.e., thermal budget) in the manufacturing process.

Note that one or both of the oxide 530a and the oxide 530c may be omitted. The oxide 530 may be a single layer of the oxide 530b. In the case where the oxide 530 is a stack of the oxide 530a, the oxide 530b, and the oxide 530c, the energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b. In that case, for the oxide 530c, a metal oxide that can be used for the oxide 530a is preferably used. Specifically, the atomic proportion of the element M in the constituent elements in the metal oxide used as the oxide 530c is preferably higher than the atomic proportion of the element M in the constituent elements in the metal oxide used as the oxide 530b. Moreover, the atomic ratio of the element M to In in the metal oxide used as the oxide 530c is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530c.

The energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To obtain this, the density of defect states in a mixed layer formed at the interface between the oxide 530a and the oxide 530b and the interface between the oxide 530b and the oxide 530c is preferably made low.

Specifically, when the oxide 530a and the oxide 530b or the oxide 530b and the oxide 530c contain a common element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like may be used as the oxide 530a and the oxide 530c. In addition, the oxide 530c may have a stacked-layer structure. For example, it is possible to employ a stacked-layer structure of an In—Ga—Zn oxide and a Ga—Zn oxide over the In—Ga—Zn oxide, or a stacked-layer structure of an In—Ga—Zn oxide and gallium oxide over the In—Ga—Zn oxide. In other words, the oxide 530c may employ a stacked-layer structure of an In—Ga—Zn oxide and an oxide that does not contain In.

Specifically, as the oxide 530a, a metal oxide with In:Ga:Zn=1:3:4 [atomic ratio] or 1:1:0.5 [atomic ratio] is used. As the oxide 530b, a metal oxide with In:Ga:Zn=4:2:3 [atomic ratio] or 3:1:2 [atomic ratio] is used. As the oxide 530c, a metal oxide with In:Ga:Zn=1:3:4 [atomic ratio], In:Ga:Zn=4:2:3 [atomic ratio], Ga:Zn=2:1 [atomic ratio], or Ga:Zn=2:5 [atomic ratio] is used. Furthermore, specific examples of the case where the oxide 530c has a stacked-layer structure include a stacked-layer structure of In:Ga:Zn=4:2:3 [atomic ratio] and Ga:Zn=2:1 [atomic ratio], a stacked-layer structure of In:Ga:Zn=4:2:3 [atomic ratio] and Ga:Zn=2:5 [atomic ratio], and a stacked-layer structure of In:Ga:Zn=4:2:3 [atomic ratio] and gallium oxide.

At this time, the oxide 530b serves as a main carrier path. When the oxide 530a and the oxide 530c have the above structure, the density of defect states at the interface between the oxide 530a and the oxide 530b and the interface between the oxide 530b and the oxide 530c can be made low. Thus, the influence of interface scattering on carrier conduction is small, and the transistor 510F can have a high on-state current and high frequency characteristics. Note that in the case where the oxide 530c has a stacked-layer structure, in addition to the effect of reducing the density of defect states at the interface between the oxide 530b and the oxide 530c, the effect of inhibiting diffusion of the constituent element of the oxide 530c to the insulator 550 side is expected. More specifically, the oxide 530c has a stacked-layer structure and the oxide that does not contain In is positioned at the upper part of the stacked-layer structure, whereby the amount of In that would diffuse to the insulator 550 side can be reduced. Since the insulator 550 functions as a gate insulator, the transistor has defects in characteristics when In diffuses. Thus, when the oxide 530c has a stacked-layer structure, a highly reliable display device can be provided.

A metal oxide functioning as an oxide semiconductor is preferably used as the oxide 530. For example, as the metal oxide to be the channel-formation region in the oxide 530, a metal oxide having a bandgap of 2 eV or larger, preferably 2.5 eV or larger is preferably used. With the use of a metal oxide having such a wide bandgap, the off-state current of the transistor can be reduced. With such a transistor, a semiconductor device with low power consumption can be provided.

<Structure Example 7 of Transistor>

A structure example of a transistor 510G is described with reference to FIG. 13A and FIG. 13B. The transistor 510G is a modification example of the transistor 500. Therefore, differences from the above transistors will be mainly described to avoid repeated description. Note that the structure shown in FIG. 13A and FIG. 13B can be employed for other transistors, such as the transistor 300, included in the semiconductor device of one embodiment of the present invention.

Figure 13A:
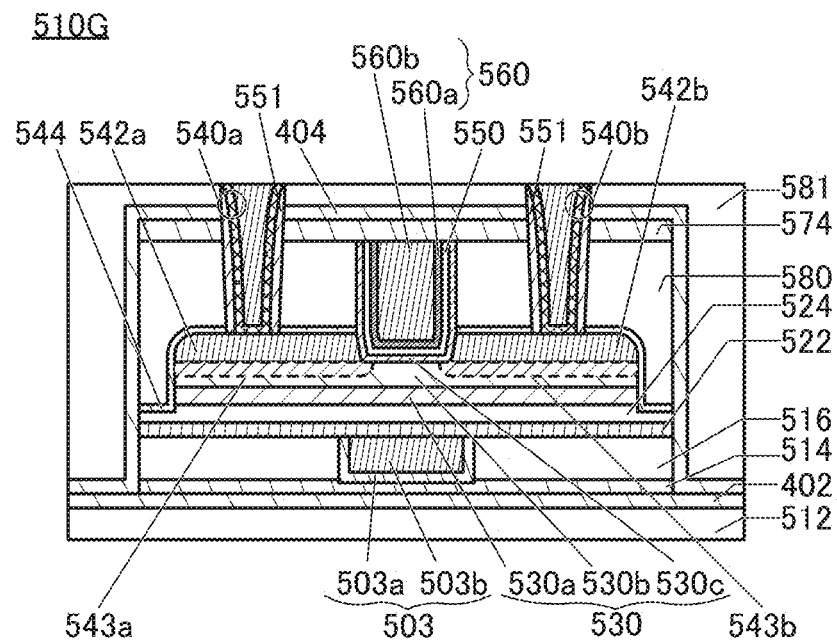
FIG. 13A and FIG. 13B are cross-sectional views showing a structure example of a transistor.
Figure 13B:
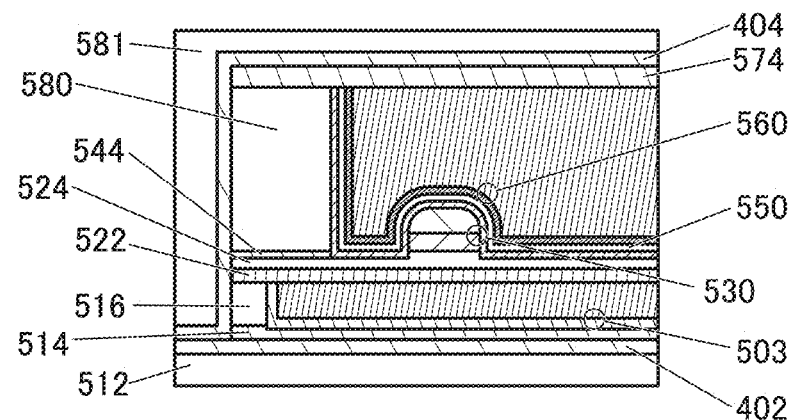

FIG. 13A is a cross-sectional view of the transistor 510G in the channel length direction, and FIG. 13B is a cross-sectional view of the transistor 510G in the channel width direction. The transistor 510G shown in FIG. 13A and FIG. 13B is different from the transistor 500 shown in FIG. 6A and FIG. 6B in including the insulator 402 and the insulator 404. Another difference from the transistor 500 shown in FIG. 6A and FIG. 6B is that the insulator 551 is provided in contact with a side surface of the conductor 540a and the insulator 551 is provided in contact with a side surface of the conductor 540b. Another difference from the transistor 500 shown in FIG. 6A and FIG. 6B is that the insulator 520 is not provided.

In the transistor 510G shown in FIG. 13A and FIG. 13B, the insulator 402 is provided over the insulator 512. In addition, the insulator 404 is provided over the insulator 574 and the insulator 402.

The transistor 510G shown in FIG. 13A and FIG. 13B has a structure in which the insulator 514, the insulator 516, the insulator 522, the insulator 524, the insulator 544, the insulator 580, and the insulator 574 are patterned and covered with the insulator 404. That is, the insulator 404 is in contact with the top surface of the insulator 574, a side surface of the insulator 574, a side surface of the insulator 580, a side surface of the insulator 544, a side surface of the insulator 524, a side surface of the insulator 522, a side surface of the insulator 516, a side surface of the insulator 514, and the top surface of the insulator 402. Thus, the oxide 530 and the like are isolated from the outside by the insulator 404 and the insulator 402.

It is preferable that the insulator 402 and the insulator 404 have higher capability of inhibiting diffusion of hydrogen (e.g., at least one of a hydrogen atom, a hydrogen molecule, and the like) or a water molecule. For example, the insulator 402 and the insulator 404 are preferably formed using silicon nitride or silicon nitride oxide with a high hydrogen barrier property. This can inhibit diffusion of hydrogen or the like into the oxide 530, thereby inhibiting the degradation of the characteristics of the transistor 510G. Consequently, the reliability of the semiconductor device including an OS transistor can be increased.

The insulator 551 is provided in contact with the insulator 581, the insulator 404, the insulator 574, the insulator 580, and the insulator 544. The insulator 551 preferably has a function of inhibiting diffusion of hydrogen or water molecules. For example, as the insulator 551, an insulator such as silicon nitride, aluminum oxide, or silicon nitride oxide that has a high hydrogen barrier property is preferably used. In particular, silicon nitride is suitably used for the insulator 551 because of its high hydrogen barrier property. The use of a material having a high hydrogen barrier property for the insulator 551 can inhibit diffusion of impurities such as water or hydrogen from the insulator 580 and the like into the oxide 530 through the conductor 540a and the conductor 540b. Furthermore, oxygen contained in the insulator 580 can be inhibited from being absorbed by the conductor 540a and the conductor 540b. Consequently, the reliability of the semiconductor device including an OS transistor can be increased.

Figure 14:
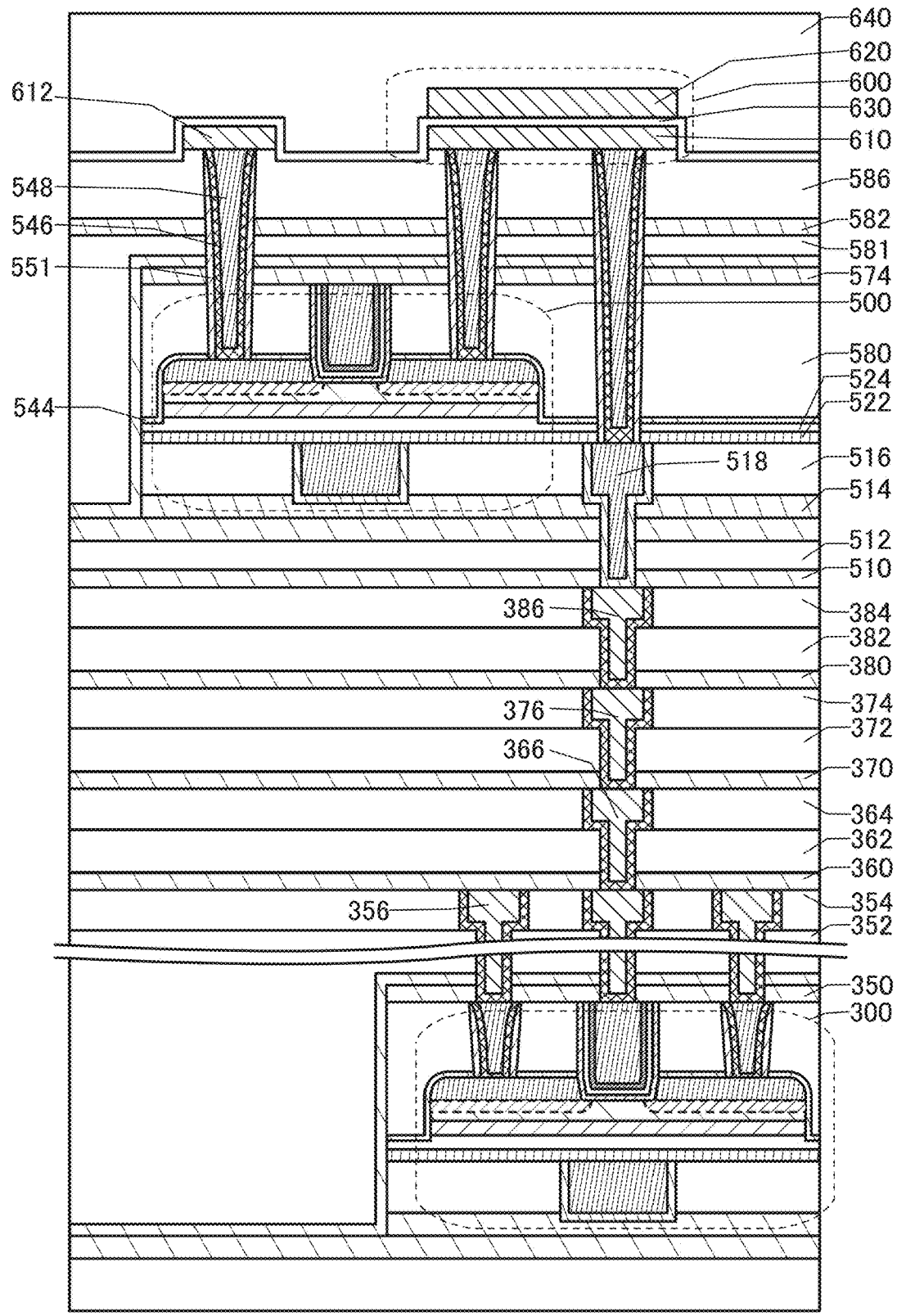
FIG. 14 is a cross-sectional view showing a structure example of a semiconductor device.

FIG. 14 is a cross-sectional view showing a structure example of the semiconductor device in the case where the transistor 500 and the transistor 300 have the structure shown in FIG. 13A and FIG. 13B. The insulator 551 is provided on the side surface of the conductor 546.

Figure 15A:
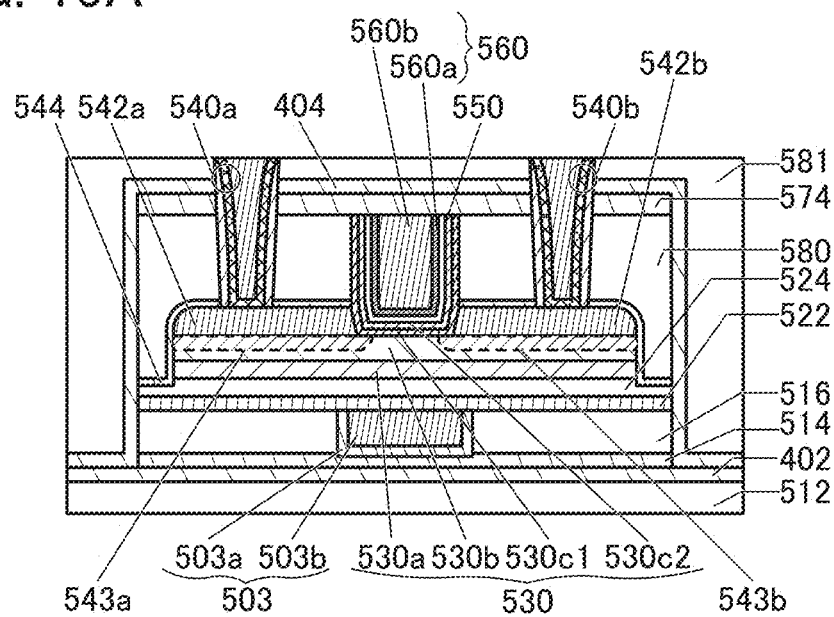
FIG. 15A and FIG. 15B are cross-sectional views showing a structure example of a transistor.
Figure 15B:
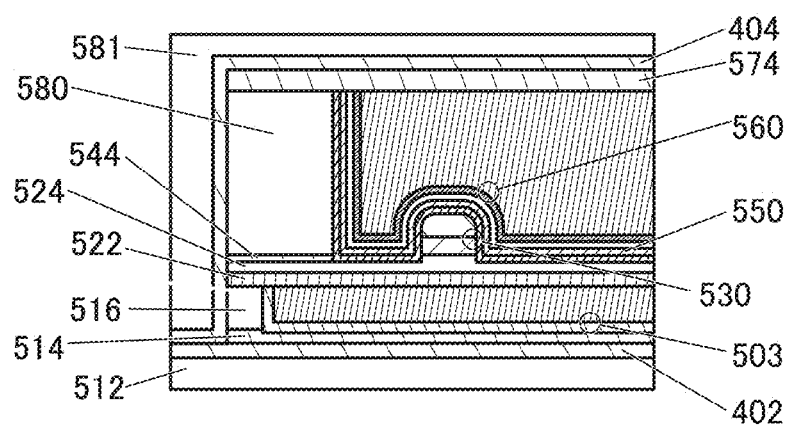

FIG. 15A and FIG. 15B show a modification example of the transistor shown in FIG. 13A and FIG. 13B. FIG. 15A is a cross-sectional view of the transistor in the channel length direction, and FIG. 15B is a cross-sectional view of the transistor in the channel width direction. The transistor shown in FIG. 15A and FIG. 15B is different from the transistor shown in FIG. 13A and FIG. 13B in that the oxide 530c has a two-layer structure of an oxide 530c1 and an oxide 530c2.

The oxide 530c1 is in contact with the top surface of the insulator 524, a side surface of the oxide 530a, the top surface and a side surface of the oxide 530b, side surfaces of the conductor 542a and the conductor 542b, a side surface of the insulator 544, and a side surface of the insulator 580. The oxide 530c2 is in contact with the insulator 550.

An In—Zn oxide can be used as the oxide 530c1, for example. For the oxide 530c2, it is possible to use a material similar to the material that can be used for the oxide 530c when the oxide 530c has a single-layer structure. For example, as the oxide 530c2, a metal oxide with In:Ga:Zn=1:3:4 [atomic ratio], Ga:Zn=2:1 [atomic ratio], or Ga:Zn=2:5 [atomic ratio] can be used.

When the oxide 530c has a two-layer structure of the oxide 530c1 and the oxide 530c2, the on-state current of the transistor can be increased as compared with the case where the oxide 530c has a single-layer structure. Thus, a transistor can be a power MOS transistor, for example. Note that the oxide 530c included in the transistor shown in FIG. 6A and FIG. 6B can also have a two-layer structure of the oxide 530c1 and the oxide 530c2.

The transistor shown in FIG. 15A and FIG. 15B can be employed for the transistor 500, the transistor 300, or both thereof.

Note that this embodiment can be implemented in appropriate combination with the other embodiments described in this specification.

Embodiment 3

In this embodiment, an oxide semiconductor that is a kind of metal oxide will be described.

The metal oxide preferably contains at least indium or zinc. In particular, indium and zinc are preferably contained. In addition, one or more kinds selected from aluminum, gallium, yttrium, tin, and the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structure>

First, the classification of the crystal structures of an oxide semiconductor will be described with reference to FIG. 16A. FIG. 16A is a diagram showing the classification of crystal structures of an oxide semiconductor, typically IGZO (a metal oxide containing In, Ga, and Zn).

As shown in FIG. 16A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite). Note that the term "Crystalline" excludes single crystal, poly crystal, and completely amorphous. The term "Crystal" includes single crystal and poly crystal.

Note that the structures in the thick frame in FIG. 16A are in an intermediate state between "Amorphous" and "Crystal", and belong to a new crystalline phase. That is, these structures are completely different from "Amorphous", which is energetically unstable, and "Crystal".

A crystal structure of a film or a substrate can be evaluated with an X-ray diffraction (XRD) spectrum. FIG. 16B shows an XRD spectrum, which is obtained by GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 16B and obtained by GIXD measurement is hereinafter simply referred to as an XRD spectrum. The CAAC-IGZO film shown in FIG. 16B has a composition in the vicinity of In:Ga:Zn=4:2:3 [atomic ratio]. The CAAC-IGZO film shown in FIG. 16B has a thickness of 500 nm.

As shown in FIG. 16B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 16B, the peak at 2θ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 16C shows a diffraction pattern of the CAAC-IGZO film. FIG. 16C shows a diffraction pattern obtained with the NBED method in which an electron beam is incident in the direction parallel to the substrate. The composition of the CAAC-IGZO film shown in FIG. 16C is In:Ga:Zn=4:2:3 [atomic ratio] or the neighborhood thereof. In the nanobeam electron diffraction method, electron diffraction is performed with a probe diameter of 1 nm.

As shown in FIG. 16C, a plurality of spots indicating c-axis alignment are observed in the diffraction pattern of the CAAC-IGZO film.

<<Structure of Oxide Semiconductor>>

Oxide semiconductors might be classified in a manner different from that in FIG. 16A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS will be described in detail.

[CAAC-OS]

The CAAC-OS is an oxide semiconductor that has a plurality of crystal regions each of which has c-axis alignment in a particular direction. Note that the particular direction refers to the thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In—M—Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M, Zn) layer) are stacked. Indium and the element M can be replaced with each other. Therefore, indium may be contained in the (M, Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by Out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear crystal grain boundary is observed is what is called polycrystal. It is highly probable that the crystal grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (i.e., thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by Out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[a-like OS]

The a-like OS is an oxide semiconductor having a structure between those of the nc-OS and the amorphous oxide semiconductor. The a-like OS includes a void or a low-density region. That is, the a-like OS has low crystallinity as compared with the nc-OS and the CAAC-OS. Moreover, the a-like OS has higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, in EDX mapping obtained by energy dispersive X-ray spectroscopy (EDX), it is confirmed that the CAC-OS in the In—Ga—Zn oxide has a composition in which the region containing In as its main component (the first region) and the region containing Ga as its main component (the second region) are unevenly distributed and mixed.

In the case where the CAC-OS is used for a transistor, a switching function (On/Off switching function) can be given to the CAC-OS owing to the complementary action of the conductivity derived from the first region and the insulating property derived from the second region. A CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility ($\mu$), and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for the transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using as a semiconductor an oxide semiconductor containing nitrogen is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$.

When an oxide semiconductor with sufficiently reduced impurities is used for the channel formation region of the transistor, stable electrical characteristics can be given.

Note that the composition, structure, method, and the like described in this embodiment can be used in appropriate combination with the compositions, structures, methods, and the like described in the other embodiments and the like.

REFERENCE NUMERALS

Q11: charge, Q12: charge, C11: capacitor, C12: capacitor, S1: signal, S2: signal, S3: signal, S4: signal, S5: signal, SW1: switch, SW1_1: switch, SW1_2: switch, SW2: switch, SW2_1: switch, SW2_2: switch, SW3: switch, SW3_1: switch, SW3_2: switch, INP: input terminal, INM: input terminal, OUTP: output terminal, OUTM: output terminal, T11: terminal, T12: terminal, T13: terminal, T14: terminal, T15: terminal, T16: terminal, T21: terminal, T22: terminal, T23: terminal, T24: terminal, T31: terminal, T32: terminal, T33: terminal, T34: terminal, T_BN: terminal, T_BP: terminal, T_CN: terminal, T_COM: terminal, T_CP: terminal, T_VDD: terminal, VDD: power supply potential, 11: transistor, 12: transistor, 13: transistor, 20: chopping circuit, 20_1: chopping circuit, 20_2: chopping circuit, 21: transistor, 22: transistor, 23: transistor, 24: transistor, 30: amplifier, 31: transistor, 32: transistor, 33: transistor, 34: transistor, 35: transistor, 36: transistor, 37: transistor, 38: transistor, 39: transistor, 41: transistor, 42: transistor, 43: transistor, 44: transistor, 100: semiconductor device, 300: transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 402: insulator, 404: insulator, 500: transistor, 503: conductor, 503a: conductor, 503b: conductor, 505: conductor, 505a: conductor, 505b: conductor, 510: insulator, 510A: transistor, 510B: transistor, 510C: transistor, 510D: transistor, 510E: transistor, 510F: transistor, 510G: transistor, 511: insulator, 512: insulator, 514: insulator, 516: insulator, 518: conductor, 520: insulator, 521: insulator, 522: insulator, 524: insulator, 530: oxide, 530a: oxide, 530b: oxide, 530c: oxide, 530c1: oxide, 530c2: oxide, 531: region, 531a: region, 531b: region, 540a: conductor, 540b: conductor, 542: conductor, 542a: conductor, 542b: conductor, 543: region, 543a: region, 543b: region, 544: insulator, 545: insulator, 546: conductor, 546a: conductor, 546b: conductor, 547: conductor, 547a: conductor, 547b: conductor, 548: conductor, 550: insulator, 551: insulator, 552: metal oxide, 560: conductor, 560a: conductor, 560b: conductor, 570: insulator, 571: insulator, 573: insulator, 574: insulator, 575: insulator, 576: insulator, 576a: insulator, 576b: insulator, 580: insulator, 581: insulator, 582: insulator, 584: insulator, 586: insulator, 600: capacitive element, 610: conductor, 612: conductor, 620: conductor, 630: insulator, 650: insulator

The invention claimed is:

1. A semiconductor device comprising:
   a switch;
   first and second capacitors;
   first and second chopping circuits;
   an amplifier;
   first and second input terminals; and
   first and second output terminals,
   wherein the amplifier comprises a non-inverting input terminal, an inverting input terminal, an inverting output terminal, and a non-inverting output terminal,
   wherein the semiconductor device electrically connects the first input terminal and one terminal of the first capacitor, electrically connects the second input terminal and one terminal of the second capacitor, directly connects the other terminal of the first capacitor and the first output terminal, and directly connects the other terminal of the second capacitor and the second output terminal in a first period,
   wherein the first chopping circuit electrically connects the other terminal of the first capacitor and the non-inverting input terminal and electrically connects the other terminal of the second capacitor and the inverting input terminal in the first period, wherein the second chopping circuit electrically connects the inverting output terminal and the first output terminal and electrically connects the non-inverting output terminal and the second output terminal in the first period, wherein the semiconductor device electrically connects the one terminal of the first capacitor and the first output terminal and electrically connects the one terminal of the second capacitor and the second output terminal in a second period, wherein the first chopping circuit electrically connects the other terminal of the first capacitor and the non-inverting input terminal and electrically connects the other terminal of the second capacitor and the inverting input terminal in the second period, wherein the second chopping circuit electrically connects the inverting output terminal and the first output terminal and electrically connects the non-inverting output terminal and the second output terminal in the second period, wherein the semiconductor device electrically connects the one terminal of the first capacitor and the first output terminal and electrically connects the one terminal of the second capacitor and the second output terminal in a third period, wherein the first chopping circuit electrically connects the other terminal of the first capacitor and the inverting input terminal and electrically connects the other terminal of the second capacitor and the non-inverting input terminal in the third period, and wherein the second chopping circuit electrically connects the non-inverting output terminal and the first output terminal and electrically connects the inverting output terminal and the second output terminal in the third period.

2. The semiconductor device according to claim 1,
wherein the switch, the first chopping circuit, and the second chopping circuit each comprise a transistor, and
wherein the transistor comprises a metal oxide in a channel formation region.

3. An operation method of a semiconductor device comprising:
a switch;
first and second capacitors;
first and second chopping circuits;
an amplifier;
first and second input terminals; and
first and second output terminals,
wherein the amplifier comprises a non-inverting input terminal, an inverting input terminal, an inverting output terminal, and a non-inverting output terminal,
wherein, in a first period, the semiconductor device electrically connects the first input terminal and one terminal of the first capacitor, electrically connects the second input terminal and one terminal of the second capacitor, directly connects the other terminal of the first capacitor and the first output terminal, and directly connects the other terminal of the second capacitor and the second output terminal,
wherein, in the first period, the first chopping circuit electrically connects the other terminal of the first capacitor and the non-inverting input terminal and electrically connects the other terminal of the second capacitor and the inverting input terminal, wherein, in the first period, the second chopping circuit electrically connects the inverting output terminal and the first output terminal and electrically connects the non-inverting output terminal and the second output terminal, wherein, in a second period, the semiconductor device electrically connects the one terminal of the first capacitor and the first output terminal and electrically connects the one terminal of the second capacitor and the second output terminal, wherein, in the second period, the first chopping circuit electrically connects the other terminal of the first capacitor and the non-inverting input terminal and electrically connects the other terminal of the second capacitor and the inverting input terminal, wherein, in the second period, the second chopping circuit electrically connects the inverting output terminal and the first output terminal and electrically connects the non-inverting output terminal and the second output terminal, wherein, in a third period, the semiconductor device electrically connects the one terminal of the first capacitor and the first output terminal and electrically connects the one terminal of the second capacitor and the second output terminal, wherein, in the third period, the first chopping circuit electrically connects the other terminal of the first capacitor and the inverting input terminal and electrically connects the other terminal of the second capacitor and the non-inverting input terminal, and wherein, in the third period, the second chopping circuit electrically connects the non-inverting output terminal and the first output terminal and electrically connects the inverting output terminal and the second output terminal.

4. The operation method of a semiconductor device according to claim 3,
wherein the switch, the first chopping circuit, and the second chopping circuit each comprise a transistor, and
wherein the transistor comprises a metal oxide in a channel formation region.

5. A semiconductor device comprising:
first to sixth switches,
first and second capacitors,
first and second chopping circuits,
an amplifier,
first and second input terminals, and
first and second output terminals,
wherein the amplifier comprises a non-inverting input terminal, an inverting input terminal, an inverting output terminal, and a non-inverting output terminal,
wherein the first chopping circuit comprises first to fourth terminals,
wherein the second chopping circuit comprises fifth to eighth terminals,
wherein the first input terminal is electrically connected to one terminal of the first switch,
wherein the second input terminal is electrically connected to one terminal of the second switch,
wherein the other terminal of the first switch is electrically connected to one terminal of the third switch and one terminal of the first capacitor,
wherein the other terminal of the second switch is electrically connected to one terminal of the fourth switch and one terminal of the second capacitor, wherein the other terminal of the first capacitor is electrically connected to one terminal of the fifth switch and the first terminal, wherein the other terminal of the second capacitor is electrically connected to one terminal of the sixth switch and the second terminal, wherein the third terminal is electrically connected to the non-inverting input terminal, wherein the fourth terminal is electrically connected to the inverting input terminal, wherein the inverting output terminal is electrically connected to the fifth terminal, wherein the non-inverting output terminal is electrically connected to the sixth terminal, wherein the seventh terminal is directly connected to the other terminal of the third switch, the other terminal of the fifth switch, and the first output terminal, wherein the eighth terminal is directly connected to the other terminal of the fourth switch, the other terminal of the sixth switch, and the second output terminal, wherein the first chopping circuit has a function of bringing the first terminal and the third terminal into a conduction state and a function of bringing the second terminal and the fourth terminal into a conduction state in a first period, wherein the second chopping circuit has a function of bringing the fifth terminal and the seventh terminal into a conduction state and a function of bringing the sixth terminal and the eighth terminal into a conduction state in the first period, wherein the first chopping circuit has a function of bringing the first terminal and the fourth terminal into a conduction state and a function of bringing the second terminal and the third terminal into a conduction state in a second period, and wherein the second chopping circuit has a function of bringing the fifth terminal and the eighth terminal into a conduction state and a function of bringing the sixth terminal and the seventh terminal into a conduction state in the second period.

6. The semiconductor device according to claim 5, wherein the first to sixth switches, the first chopping circuit, and the second chopping circuit each comprise a transistor, and wherein the transistor comprises a metal oxide in a channel formation region.

* * * * *